United States Patent [19]
Cioffi

[11] Patent Number: 4,992,752
[45] Date of Patent: Feb. 12, 1991

[54] METHOD AND APPARATUS FOR BROADBAND IMPEDANCE MATCHING

[75] Inventor: Kenneth R. Cioffi, Anaheim Hills, Calif.

[73] Assignee: Rockwell International, El Segundo, Calif.

[21] Appl. No.: 364,058

[22] Filed: Jun. 9, 1989

[51] Int. Cl.$^5$ ............................................. H03F 3/60
[52] U.S. Cl. ...................................... 330/54; 330/277; 333/124
[58] Field of Search ............... 330/54, 277; 333/124, 333/125, 127

[56] References Cited
U.S. PATENT DOCUMENTS
4,543,535 9/1985 Ayasli ................................ 330/54 X FOREIGN PATENT DOCUMENTS
764101 9/1980 U.S.S.R. ................................ 330/54

*Primary Examiner*—James B. Mullins
*Attorney, Agent, or Firm*—H. Fredrick Hamann; George A. Montanye; Gregory D. Ogrod

[57] ABSTRACT

An apparatus and method are disclosed for performing impedance transformations on the order of 4:1 to 8:1 or more over extremely broad bandwidths. The transformations are performed in an apparatus having a plurality of n distributed amplifiers having one common synthetic transmission line sharing inductive elements and a second transmission line connected in parallel to the other transmission lines. The transmission lines incorporate active elements preferably in the form of FET cascode pairs. In one embodiment, the second transistor of each cascode pair is replaced with n smaller gate FETs to decrease DC power requirements and provide additional doncution paths for impedance reduction.

33 Claims, 18 Drawing Sheets

METHOD AND APPARATUS FOR BROADBAND IMPEDANCE MATCHING

BACKGROUND OF THE INVENTION

1. Field of the Invention

The present invention relates to impedance matching, and more particularly to a method and apparatus for performing impedance transformations between dissimilar circuit input and output load impedances over broad bandwidths. The invention further relates to employing parallel distributed amplifiers in an amplifier structure to obtain large impedance matching ratios between input and output loads.

2. Related Technical Art

In many applications, it is necessary to transfer electronic signals between components, devices, or systems having different input/output load impedances. That is, the characteristic output impedance for one device or system may differ from the characteristic input impedance of a corresponding load device connected to that output. Any impedance mismatch results in signal reflection or attenuation and a signal being transferred between the devices or systems may experience severe degradation or noise.

To avoid the deleterious effects of impedance mismatching, a variety of devices or circuits have been used to perform impedance transformations. An impedance transformation device receives signals at an input having a first operating impedance, which approximates the characteristic impedance of an input load, and transfers the signal to an output operating at a second impedance which approximates that of a proposed load. One such device is an impedance matching transformer having windings whose characteristic inductive impedance matches that of the respective input and output loads. In microwave applications, quarter wavelength transformers have proven useful for impedance matching.

However, the use of transformer-type impedance transformation devices is generally limited to fixed frequency or resistive impedance load applications. The inductive nature of the transformer makes its output very dependent on operating frequency and it cannot be designed to accommodate large bandwidths. In addition, since a transformer design is static, a transformer cannot adjust to frequency dependent or adjustable impedance changes in reactive loads.

Another impedance transformation or matching technique is the application of reactively tuned amplifiers. Here, appropriately biased transistors are used to transfer an input signal (power) from a source having a first characteristic impedance to a load with a different impedance over a specified frequency range. Within any amplifier design, transistor or transistor stage impedance matching then becomes an important design problem. There is a natural attenuation or gain roll-off that occurs across the frequency limits. To compensate for transistor impedance matching and roll-off, matched amplifier stages are required. While this is conventionally accomplished, it requires complex circuit designs, careful component selection and matching, and multi-sectional filters among other design considerations. The resulting designs can cover moderate band widths with high power. Unfortunately, this approach has proven to be too complex, costly, and difficult for alignment and tuning for most very high frequency applications. This technique does not lend itself to monolithic, mass produced circuits. In addition, the operating bandwidth of reactive circuits is limited by the reactive matching network which is known to have about a two octave limit.

One proposed method of transferring signals over a very high bandwidth, especially at high frequencies, is to use distributed amplifiers. Such amplifiers achieve very broad band signal amplification and show potential for obtaining up to five to six octave bandwidths. However, distributed amplifiers transfer signals between input and impedances of the same value. If there is a difference in the impedances of the loads, signal degradation occurs and the amplification or gain of the circuit is relied upon to compensate for losses. However, impedance mismatch significantly affects output power and amplifier efficiency, and contributes to high signal reflection which in turn causes poor VSWR.

What is needed in the art is a method or apparatus for transferring signals between elements or loads having widely different characteristic impedances. The method needs to have a very broad bandwidth response at very high frequencies. It would be advantageous to obtain appreciable signal gain during transfer with very flat response over the apparatus bandwidth.

SUMMARY OF THE INVENTION

With the above problems of the art in mind, it is one purpose of the present invention to provide a method and apparatus for impedance transformation at very high frequencies.

An advantage of the invention is that it provides an apparatus for impedance matching that is readily reduced to a monolithic structure.

Another purpose of the invention is to provide an apparatus for impedance matching that provides large impedance ratios between the output and input.

Another advantage of the invention is that it provides low reflection and highly stable operation over a broad frequency range.

These and other purposes, objects, and advantages are obtained in an apparatus for performing impedance transformations comprising a plurality of n parallel distributed amplifiers each distributed amplifier having a series of m active elements combined with passive components to form a pair of synthetic transmission line structures. The m active elements comprise elements such as, but not limited to. GaAs field effect transistors which amplify the signal being transferred. Each transmission line comprises shunt input and output capacitances for each active element, series inductance, and a termination impedance Z, typically in the form of a resistor. In some embodiments, additional output shunt capacitors or inductors are added on output transmission lines to adjust impedance and phase velocities. The value of any added capacitance and the series inductances are determined by requiring input and output transmission line phase velocities to be equal.

The distributed amplifiers are configured to have at least one common transmission line using the same series inductance elements and termination impedance. The other transmission line for each distributed amplifier is connected in parallel with the second transmission lines of the other amplifiers. In most preferred embodiments, only one common transmission line is connected through m active elements to n parallel transmission lines. Input signals are applied to n parallel, or the single common, transmission lines, each having a characteristic input impedance of $Z_0$, and output signals are derived from either a single or a plurality of n parallel transmission lines, respectively, also having an output impedance of $Z_0$. Therefore, the impedance transformation accomplished is either $Z_0/n$ to $Z_0$ or $Z_0$ to $Z_0/n$.

In preferred embodiments, the active elements each comprise cascode pairs of field effect transistors configured as m parallel sets of n pairs per set connected to the transmission lines between each line inductance.

It has been found that the output gain for the apparatus of the invention is about 2 dB higher and its return loss is significantly lower, 5 to 15 dB, than previous distributed amplifier circuits having adjusted impedance values for each transmission line. While conventional circuits become conditionally stable at about 12.5 GHz, the apparatus of the invention is unconditionally stable across all frequencies with a stability factor greater than 3.

In further embodiments, the cascode transistor pairs each comprise 0.5 $\mu$m gate length GaAs FETs. The common source FETs may be designed as single FET structures using a split source and the common gate FETs designed with gate connections on both sides. This dual FET structure results in minimized parasitic capacitances and minimum complexity for easy circuit implementation.

An alternative embodiment has also been discovered which is useful as a broadband matching circuit for a semiconductor laser where an 8:1 impedance transformation is typically required. In this latter embodiment, the common gate FET of a cascode pair is replaced by n source coupled common gate FETs, each having a gate width on the order of 1/n times the gate width of a common source FET. This reduces the DC power required to operate the transformation circuit by a factor of n and increases the bandwidth by a factor of n.

In one embodiment of the semiconductor laser circuit, an 8:1 impedance transformation is obtained by using n=4 parallel output transmission lines and one input transmission line while also terminating each transmission line in half the input impedance which effects an additional 2:1 impedance reduction. It is believed this circuit has the desired impedance match over the frequency range from 0.5 to 12.5 GHz with a gain of 8.5±1 dB from 0.5 to 12.5 GHz and better than 10 dB return loss at both the input and output based on known S-parameters for 200 $\mu$m gate width and 0.25 $\mu$m gate length AlGaAs HEMTs.

BRIEF DESCRIPTION OF THE DRAWINGS

The novel features of the present invention may be better understood from the accompanying description when taken in conjunction with the accompanying drawings in which.

DETAILED DESCRIPTION OF PREFERRED EMBODIMENTS

The present invention provides a method and apparatus for matching dissimilar load impedances between two devices or systems over a broad bandwidth at high frequencies. The impedance matching is accomplished by using n parallel distributed amplifiers with one common transmission line and n parallel transmission lines each of which are generally terminated in a desired characteristic impedance Z. Impedance transformations are achieved by using either the common or parallel transmission lines as inputs or outputs. Therefore, transformations of Z/n to Z or Z to Z/n are performed in this configuration. Alternatively, additional elements are employed to achieve fractional or very large impedance transformation ratios.

Figure 1:
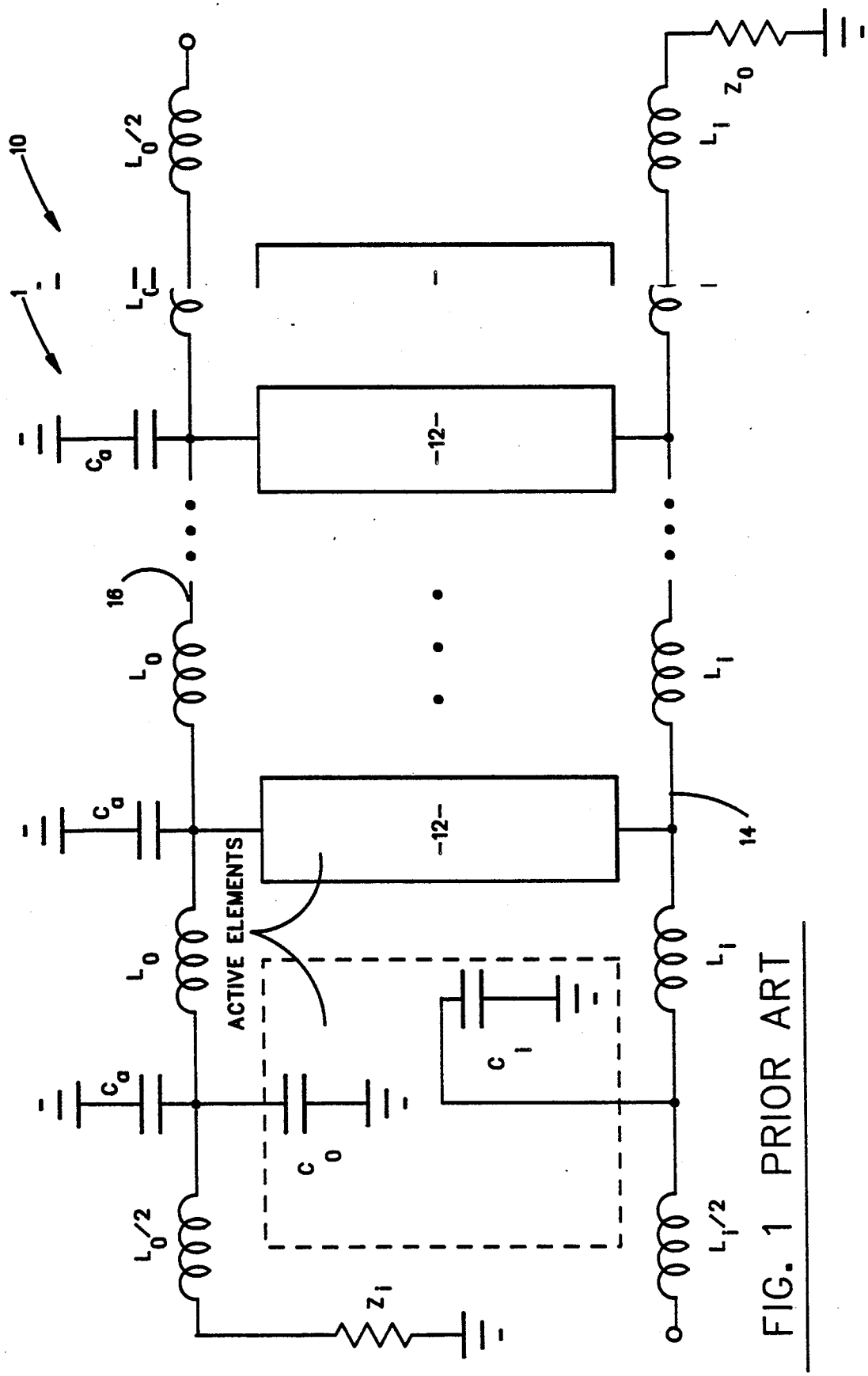
FIG. 1 illustrates a functional overview of distributed amplifier circuits.

The basic configuration of a distributed amplifier is shown in the functional overview of FIG. 1. In FIG. 1, a distributed amplifier 10 is shown employing a series of active elements 12 distributed along a transmission line-like structure by inductive input line 14 and indicative output line 16. Each active element 12 comprises elements such as, but not limited to, field effect transistors which amplify the signal being transferred. In the amplifier structure 10, each inductive line, 14 or 16, comprises a series of inductances, $L_i$ or $L_0$, and a termination impedance $Z_0$ or $Z_i$, respectively. Were the termination impedances are implemented as resistors. Each active element is illustrated as having an input shunt capacitance $C_i$ and an output shunt capacitance $C_0$. For reasons discussed below, additional output shunt capacitors $C_a$ are generally required.

The distributed amplifier structure illustrated in FIG. 1 is well known in the art and its structure and operation are described in more detail in the literature, such as in the article series "DISTRIBUTED AMPLIFIERS: THEIR TIME COMES AGAIN," Part 1, appearing in MICROWAVES & RF, November 1984, pages 119-127, and Part 2 in MICROWAVES & RF, December 1984, pages 126–153, both by W. Kennan and N. K. Osbrink, which are incorporated herein by reference.

In a distributed amplifier, active elements used for amplification of input signals are combined with passive components to form transmission line-like structures. This structural combination has some of the advantages of transmission lines, that of very broad bandwidth and gain flatness. Returning to FIG. 1, it is seen that a synthetic transmission line is formed by a shunt input capacitance for each active element 12 with an appropriate amount of series inductance. The amount of any added inductance is determined by the characteristic impedance desired for the circuit 10 input. Gain is realized during signal passage or transfer by forming a second synthetic transmission line which accepts the amplified signal from each of the active elements 12 by using the active element output capacitance $C_o$ in combination with an added shunt capacitance $C_a$. The value of $C_a$ and the series inductances $L_0$, used in the output transmission line, are each determined by requiring the input and output transmission line phase velocities to be equivalent. This requirement can be expressed as the relationship:

$$v_{pi} = \left[1 - \left(\frac{f}{f_{Ci}}\right)^2\right]^{\frac{1}{2}} / [L_i C_i]^{\frac{1}{2}} =$$

$$v_{po} = \left[1 - \left(\frac{f}{f_{Co}}\right)^2\right]^{\frac{1}{2}} / [L_0(C_o + C_i)]^{\frac{1}{2}}$$

where:

$$f_{Ci} = 1/\pi [L_i C_i]^{\frac{1}{2}}$$

$$f_{Co} = 1/\pi [L_0(C_0 + C_i)]^{\frac{1}{2}}$$

and f is the operating frequency. This condition must be satisfied for an input signal to be coupled in phase to an output signal through the active elements of the distributed amplifier 10. Otherwise, signal reflection and degradation will occur.

The input and output transmission lines comprising the distributed amplifier of FIG. 1 have characteristic impedances, $Z_i$ and $Z_0$, respectively, which are also dependent upon the values chosen for added inductances and capacitances. The impedances $Z_i$ and $Z_0$ can be approximated by the expressions:

$$Z_i = \left(\frac{L_i}{C_i}\right)^{\frac{1}{2}} \left[1 - \left(\frac{f}{f_{Ci}}\right)^2\right]^{\frac{1}{2}}$$

and $$Z_o = \left(\frac{L_o}{C_o + C_a}\right)^{\frac{1}{2}} \left[1 - \left(\frac{f}{f_{Ci}}\right)^2\right]^{\frac{1}{2}}.$$

When the input and output impedances of the distributed amplifier 10 are chosen to be equal, the simultaneous solution of these equations results in $L_i = L_0$ and $C_i = C_0 + C_a$. These expressions form the basis for determining the values of the added capacitances and inductances required for the distributed amplifier.

It can be seen that a simplistic approach to accommodate impedance transformations between two circuit loads, an input and an output, would be to adjust the capacitance and inductance values along each of the transmission lines, 14 and 16, to reflect desired impedance values, input or output, while staying within the requirements of the first equation above. That is, each transmission line is adjusted to have the matching impedance for either the input or output, as the case may be, while still restricting values to assure phase velocity matching. If the impedances are said to have ratios given by the expression $Z_i = rZ_0$, then substitution into the above equations yields:

$$C_a = rC_i - C_0$$

and $$L_0 = L_i/r$$

Those skilled in the art will, however, recognize the limited applicability of this approach to small impedance differences where reasonable performance is obtainable. When the ratio value, r in the above expressions, is less than about 0.33 to 0.25, the value of added capacitance, $C_a$ required to satisfy the above equations is negative. Since this is an unobtainable limitation, this technique cannot be used with impedance transformations on the order of 1:3 to 1:4 or greater.

Any output or input transistors employed in distributed amplifiers may also be mismatched in terms of load impedances of the transmission lines, input or output, to which they are connected. This mismatch results in reduced gain and increased noise for the circuit, which may also become operationally unstable at certain frequencies.

At the same time, signal transfers requiring large impedance transformations which use either large inductors and small capacitors (for large characteristic impedance), or small inductors and large capacitors (for small characteristic impedance), are generally hard to manufacture. Extreme values, either very large or very small, in inductive and capacitive elements are generally hard to manufacture reliably in monolithic structures and tend to make the circuit characteristics for manufactured circuits very dependent on variations and specific patterns of their manufacturing process.

The present invention overcomes these limitations by a new application of the distributed amplifier structure to an impedance matching network. The invention comprises the formation of a Constant Line Impedance (CLI) circuit structure having either "step-up" or "step-down" impedance properties for improved impedance matching or transformations.

Figure 2A:
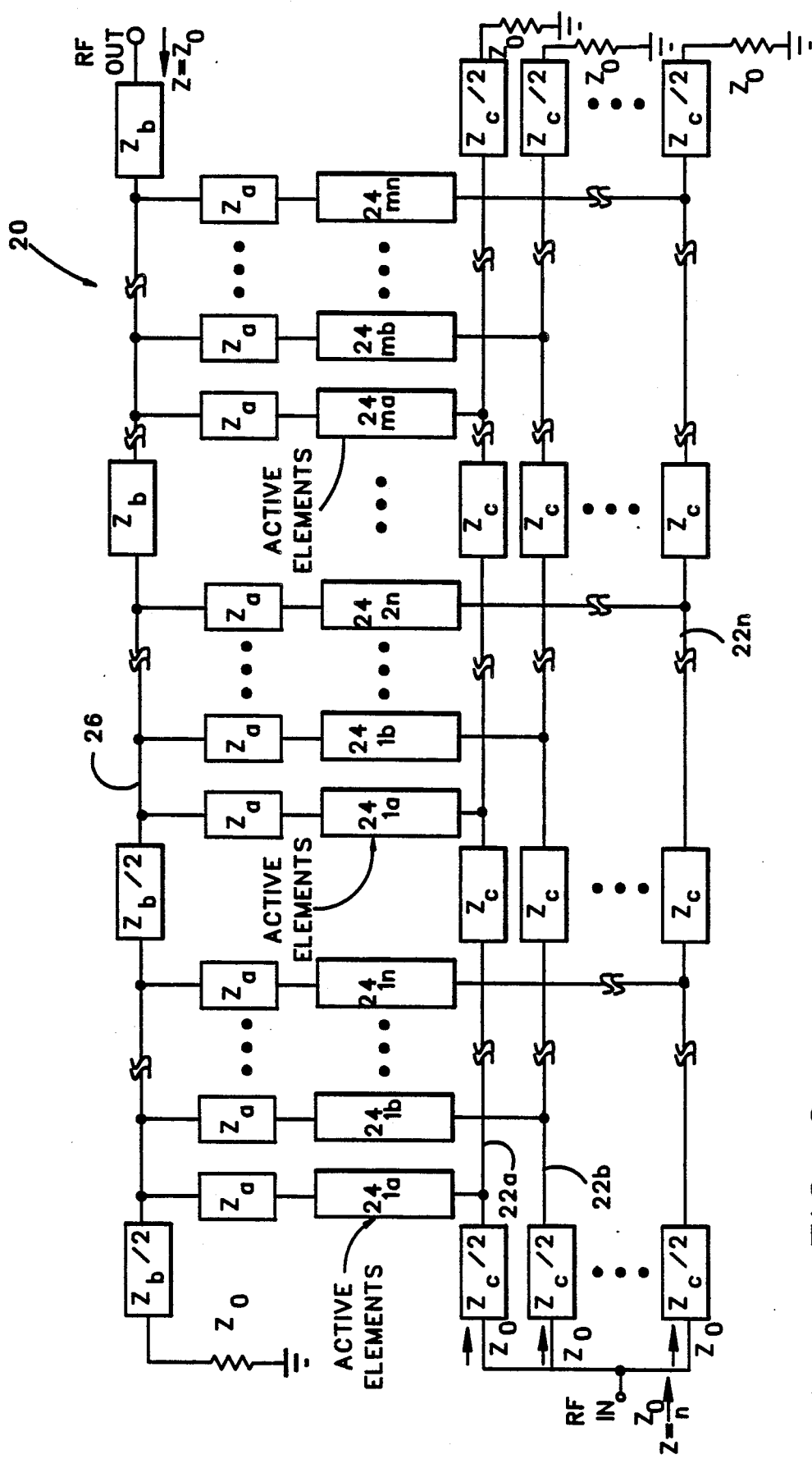
FIGS. 2a and 2b illustrates an impedance matching distributed amplifier apparatus constructed according to the principles of the present invention with FIG. 2a accomplishing increase-by-n and FIG. 2b accomplishing decrease-by-n.
Figure 2B:
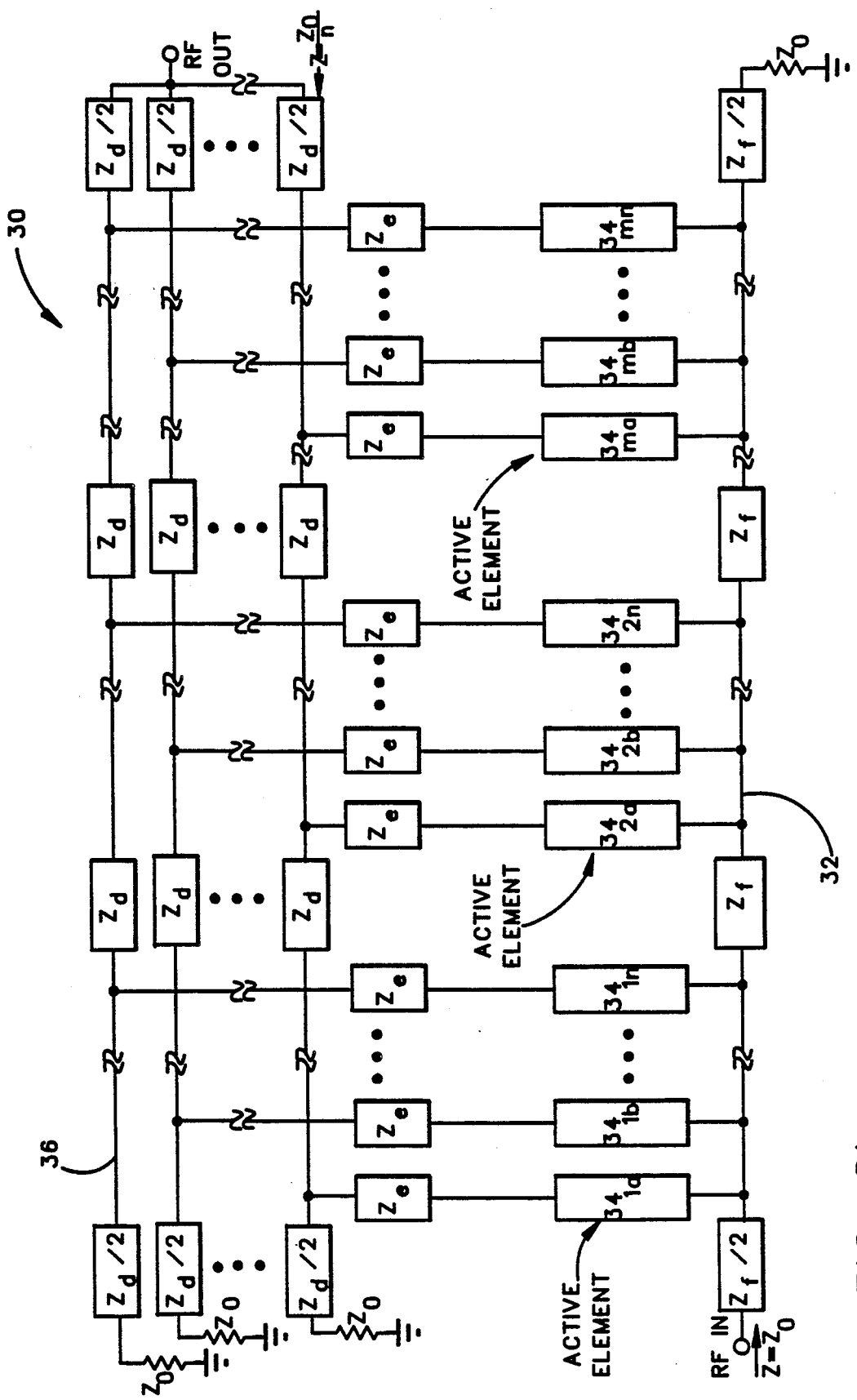

An exemplary embodiment of a distributed constant line impedance transformation amplifier constructed according to the present invention is illustrated in FIGS. 2a and 2b. In FIG. 2a, a larger output impedance is matched to a smaller input impedance accomplishing a step-up transformation. In FIG. 2a, the input signal is applied to a series of parallel input transmission lines 22a, 22b, through 22n each connected through active elements $24_l$ through $24_m$ ($24_{la}$–$24_{ln}$ through $24_{ma}$–$24_{mn}$) to a single output transmission line 26. In this configuration, an input signal is split between n parallel distributed amplifiers each having an input impedance of $Z_0$. The value of $Z_0$ is determined by the series impedance $Z_c$ and a single active element shunt capacitance. Therefore, the impedance seen by the input load is $Z_0/n$. The amplifiers all terminate into the common output transmission line, 26, containing passive elements, $Z_a$ and $Z_b$, which are adjusted to maintain or match the phase velocity of the input lines. This configuration comprises n+1 synthetic transmission lines, n input and 1 output, interconnected through the active elements 24 and having identical properties. The output impedance will be the characteristic impedance $Z_0$ of the single transmission line 26.

In FIG. 2b, a configuration for achieving signal amplification and a step-down impedance transformation between an input load with a larger impedance and an output load with a smaller impedance is illustrated. In FIG. 2b, a distributed constant line impedance transformation amplifier 30 is shown using a single or common input transmission line 32 to receive the input signal. The signal is then transferred by m parallel active elements 34 ($34_{1a}$–$34_{1n}$ through $34_{ma}$–$34_{mn}$) to a series of parallel transmission lines 36 through 36n. The value of the input line characteristic impedance $Z_0$ is determined by the series impedance $Z_f$ and a parallel combination of n active element, 34, shunt capacitances. The n distributed amplifiers each terminate in separate parallel output transmission lines, 36, having passive elements, $Z_d$ and $Z_e$, which are adjusted to maintain or match the phase velocity of the input line 32. The output transmission lines 36a through 36n are connected in parallel so that the output impedance seen by the output load is $Z_0/n$. This configuration also comprises n+1 synthetic transmission lines, with n output and 1 input, each having identical properties and resulting in a reduction in the characteristic output impedance.

In each of the FIG. 2 embodiments, m active elements were used in each transmission line. The value of m can be varied according to the desired application but those skilled in the art, will readily understand that there is a limit to the number of active elements that can be employed. It is known in the art that factors such as transistor capacitances, and overall area constraints for monolithic circuit design, act to place a limit on the number of active elements used.

The circuits of FIG. 2 also employ added inductances $Z_a$ or $Z_e$ which replace the added capacitance Ca previously described. While these impedances may include a capacitive value, they also may incorporate inductive elements such as stripline conductors.

Figure 3A:
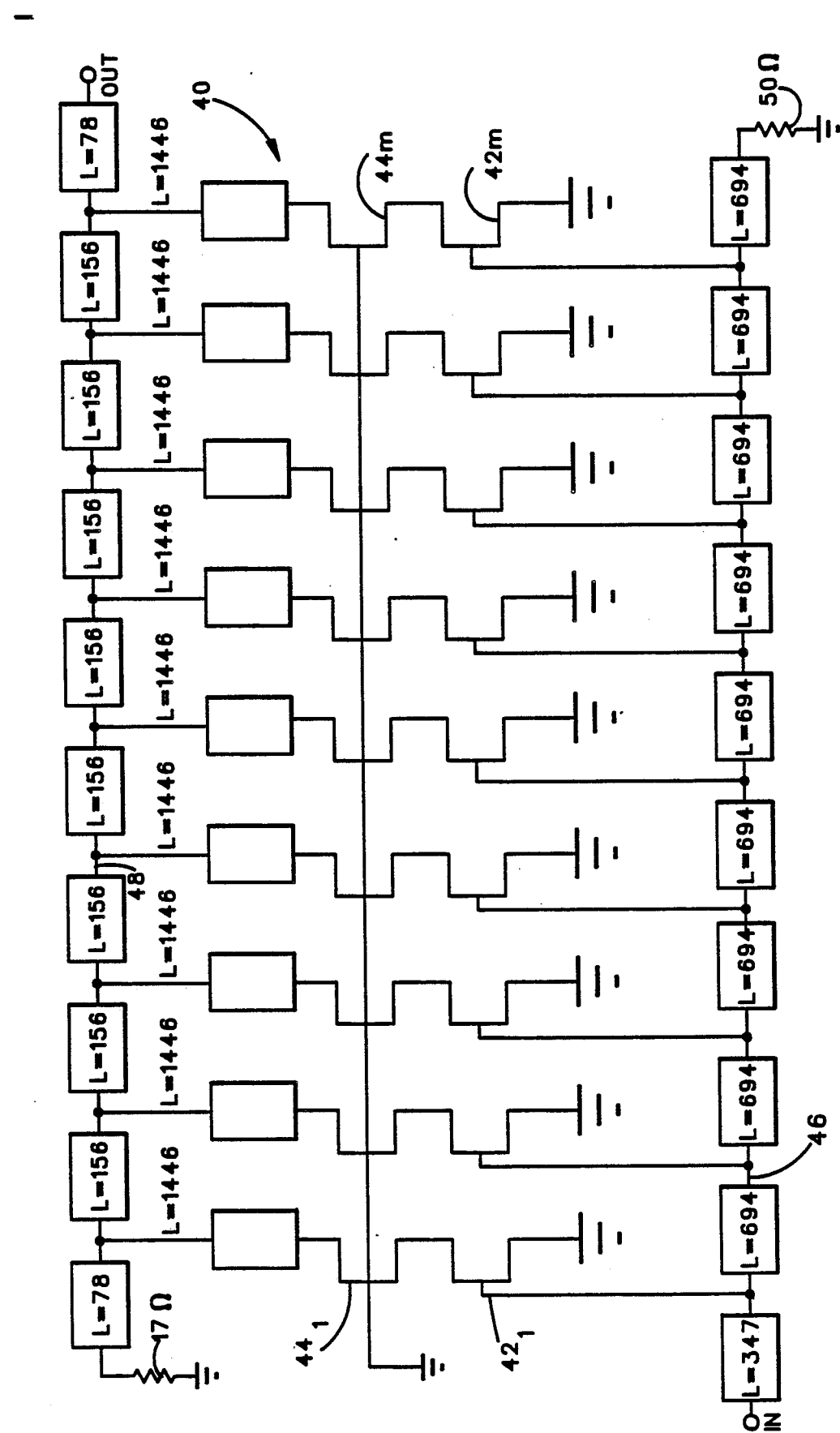
FIG. 3a illustrates a circuit implementation of the apparatus of FIG. 1.
Figure 3B:
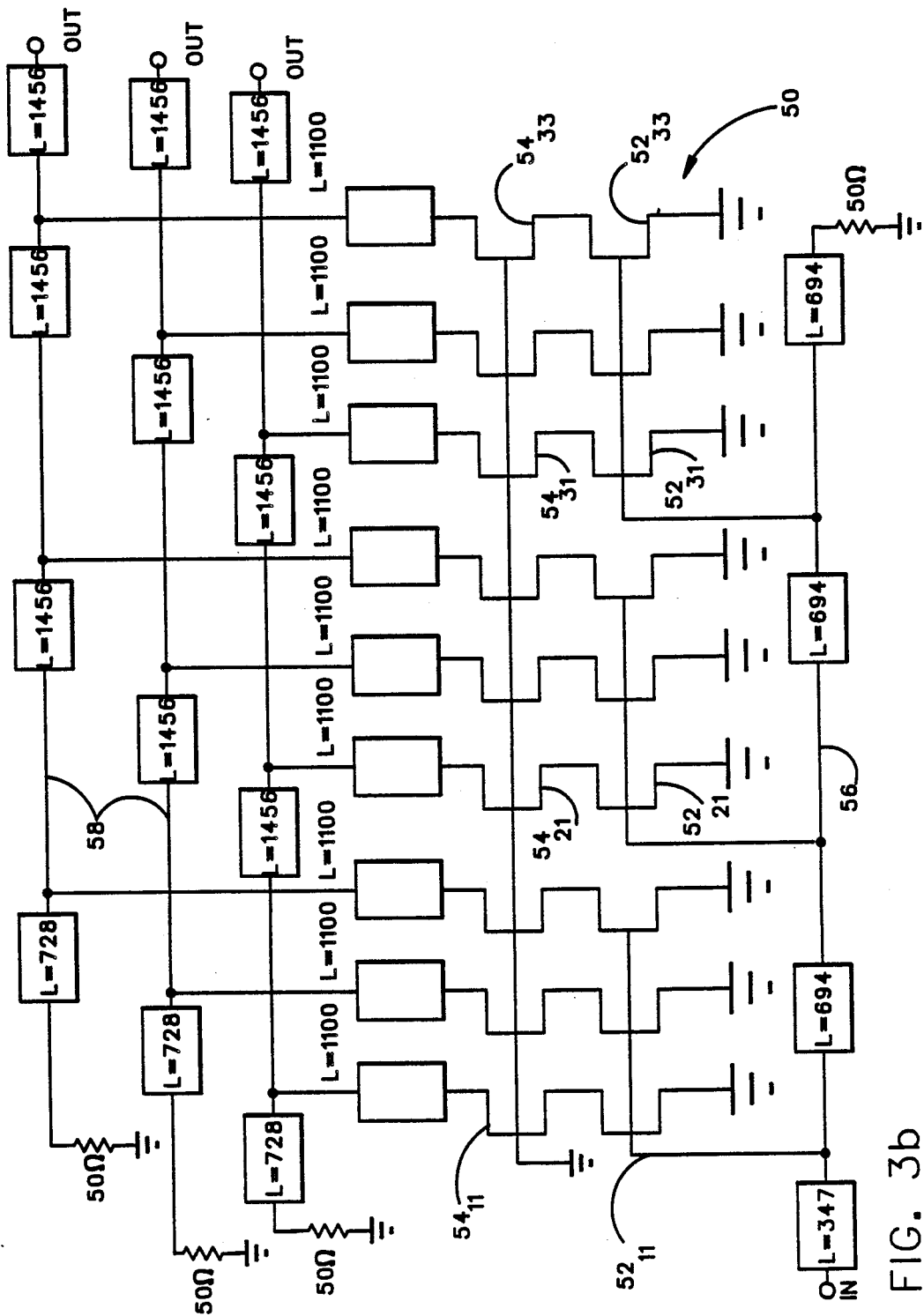
FIG. 3b illustrates a circuit implementation of the apparatus of FIG. 2.

To better understand the difference between the method and apparatus of the present invention (constant line impedance) and prior amplification techniques (line impedance variation), two comparative circuits are illustrated in further detail in FIGS. 3a and 3b. In FIG. 3aa typical distributed amplifier circuit 40 is shown implementing nine active elements as cascode pairs of FETs 42 and 44 as the active drivers and microstrip-type input and output transmission lines 46 and 48, respectively.

Those skilled in the art will readily understand the cascode configuration which is also discussed in more detail in the literature of the art. Those skilled in the art will also recognize that the value of the inductances, when using microstrip transmission line-type elements, is determined by the length and width of the elements. These dimensions are illustrated in the comparative circuits of FIGS. 3a and 3b. The specific inductance values are chosen in accordance with the above equations. For purposes of clarity in illustration, the inductances in FIG. 3 are shown to be identical in value along a given transmission line. However, to handle a greater amount of power at the output, to adjust impedance matching, or for other applications, the inductance values can be varied along a transmission line within the limitations of the above equations. Such variations are within the contemplation and teachings of the invention.

In FIG. 3a, the input transmission line 46 employs a 50 ohm termination resistor to provide a 50 ohm input impedance. The output transmission line 48, employs a 17 ohm termination resister to provide an output impedance of 17 ohm for an impedance ratio of about 3:1. The values of the microstrip transmission line inductances on both transmission lines, 46 and 48, are chosen in accordance with the equations discussed above to provide the appropriate phase velocities, and then further adjusted to provide the best gain and output match. Such adjustments are readily understood and employed by those skilled in the art to meet an application's specific operating requirements.

In FIG. 3b, an impedance transformation circuit or amplifier 50 is shown having a series of cascode pairs of field effect transistors 52 and 54 connected to a single input transmission line 56 which employs a 50 ohm termination resistor. To achieve the desired 3:1 impedance reduction, the cascode pairs 50 are arranged in parallel sets of three per set, that is there are three active elements or transistor amplifiers connected to the input transmission line 56 between each line inductance. The output FETs $54_{1m}$, $54_{2m}$, and $54_{3m}$ (here m=3), of the cascode pairs, are connected to the three output transmission lines $58_1$, $58_2$, or $58_3$, respectively, each terminated by a 50 ohm resistor. With the three output lines 58 connected in parallel, the characteristic output impedance becomes a 50/3 (17) ohms output impedance. However, those skilled in the art will understand that the present invention is not limited to the use of three parallel distributed amplifiers and other termination values may be employed in order to accommodate other impedance transformations.

Figure 4:
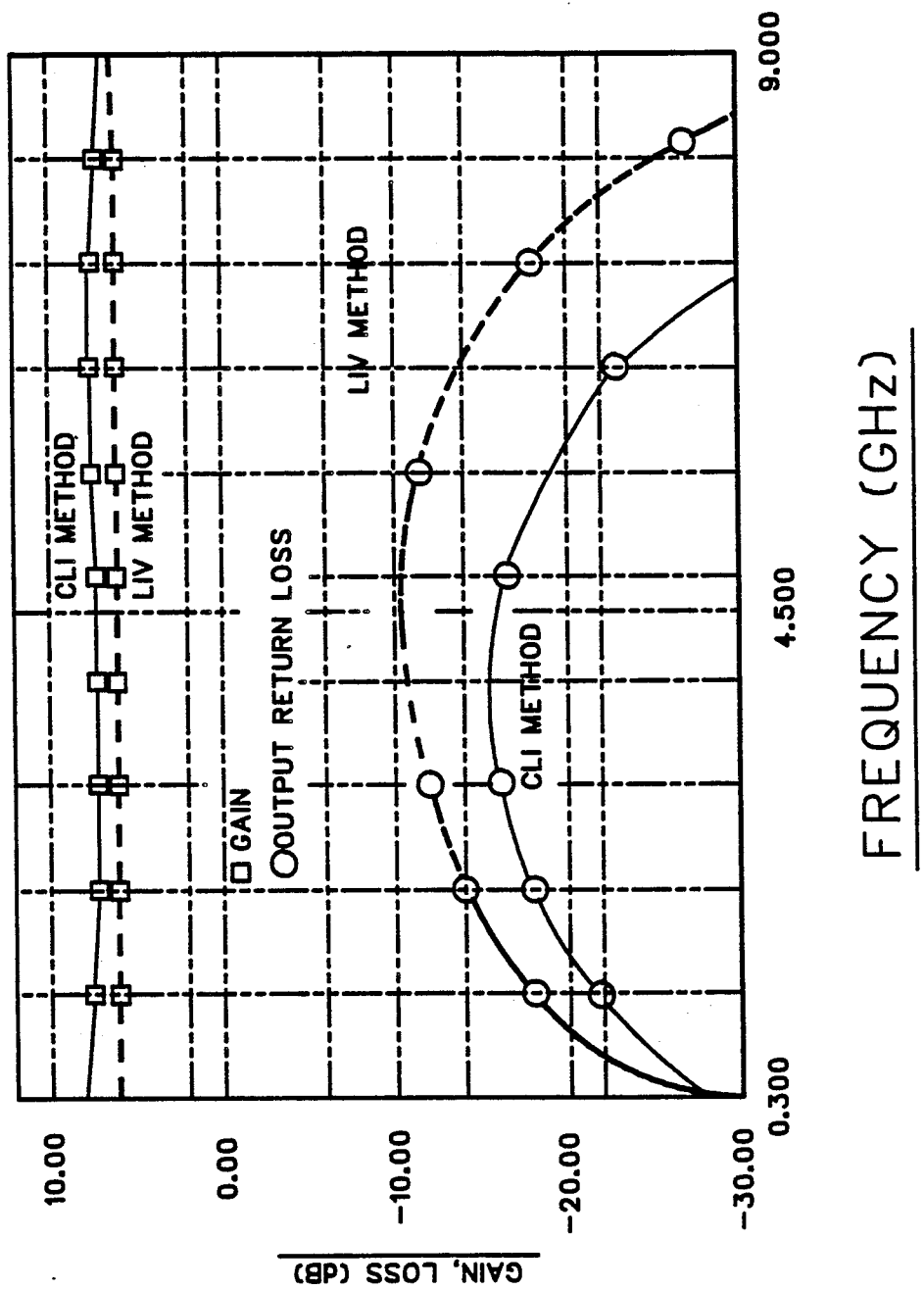
FIG. 4 provides graphical representation of output gain characteristics for the circuits of FIGS. 3a and 3b.

Derived results for gain and output return loss for the circuits of FIG. 3 are shown in graphical form in FIG. 4. The quantities appearing in the graph of FIG. 4 are derived using circuit simulation techniques generally employed by those skilled in the art. As shown in FIG. 4, the output gain for the constant line impedance (CLI) configuration of the invention is about 2 dB higher and its return loss is significantly lower, by about 5 to 15 dB. The line impedance of FIG. 3a becomes conditionally stable at about 12.5 GHz while the constant line impedance circuit of FIG. 3b is unconditionally stable across all frequencies with a stability factor greater than 3. The bandwidth of the circuit of FIG. 3b is slightly reduced by the presence of additional shunt capacitance on the input transmission line 56 due to the increased number of transistors, as used for impedance step-down transformations. However, this capacitance can be reduced and the bandwidth correspondingly increased by using another capacitor in series with the shunt transistors as demonstrated in (see reference above) or through the alternative embodiment discussed below.

Figure 5A:
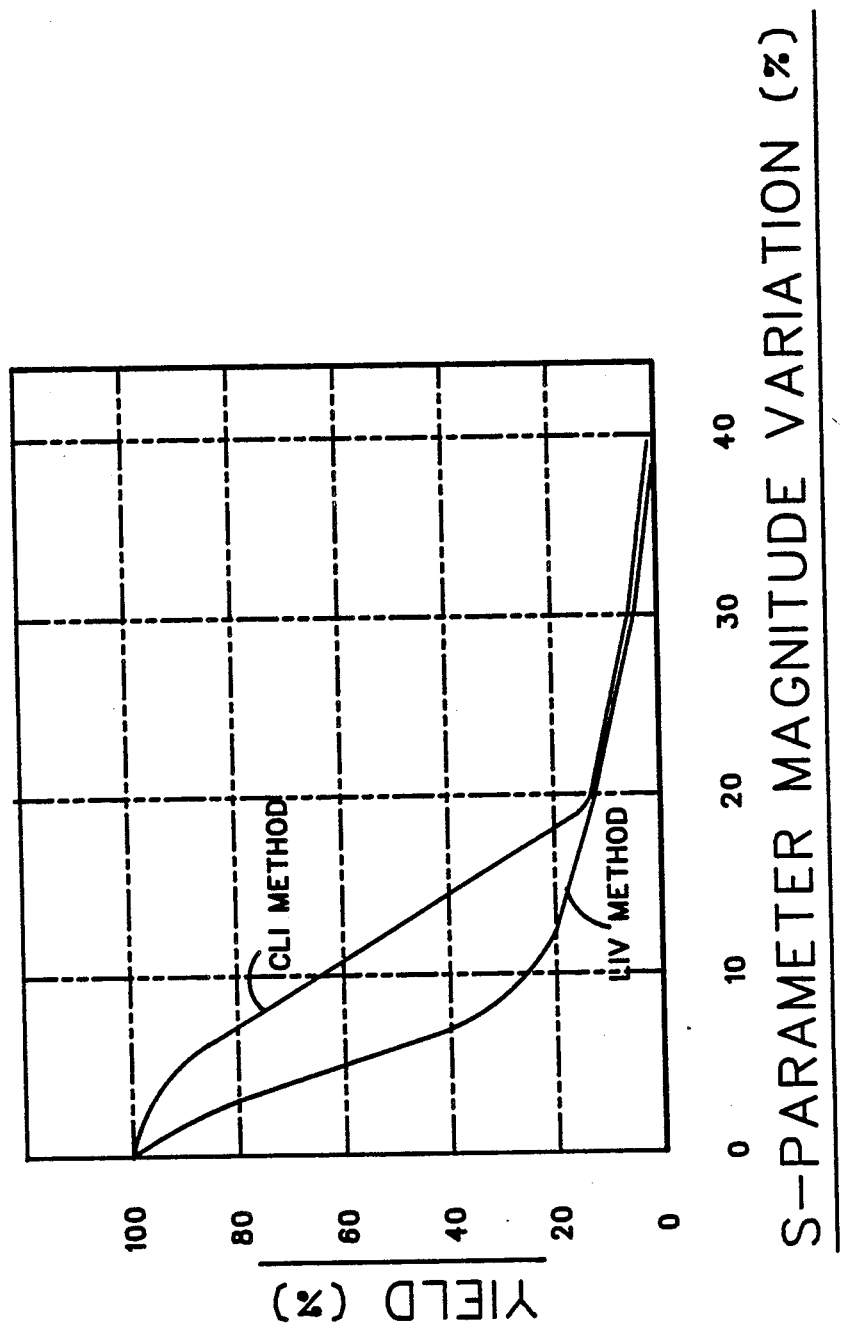
FIGS. 5a, 5b, and 5c provide graphical representation of operating and manufacturing parameters for the circuits of FIGS. 3a and 3b.
Figure 5B:
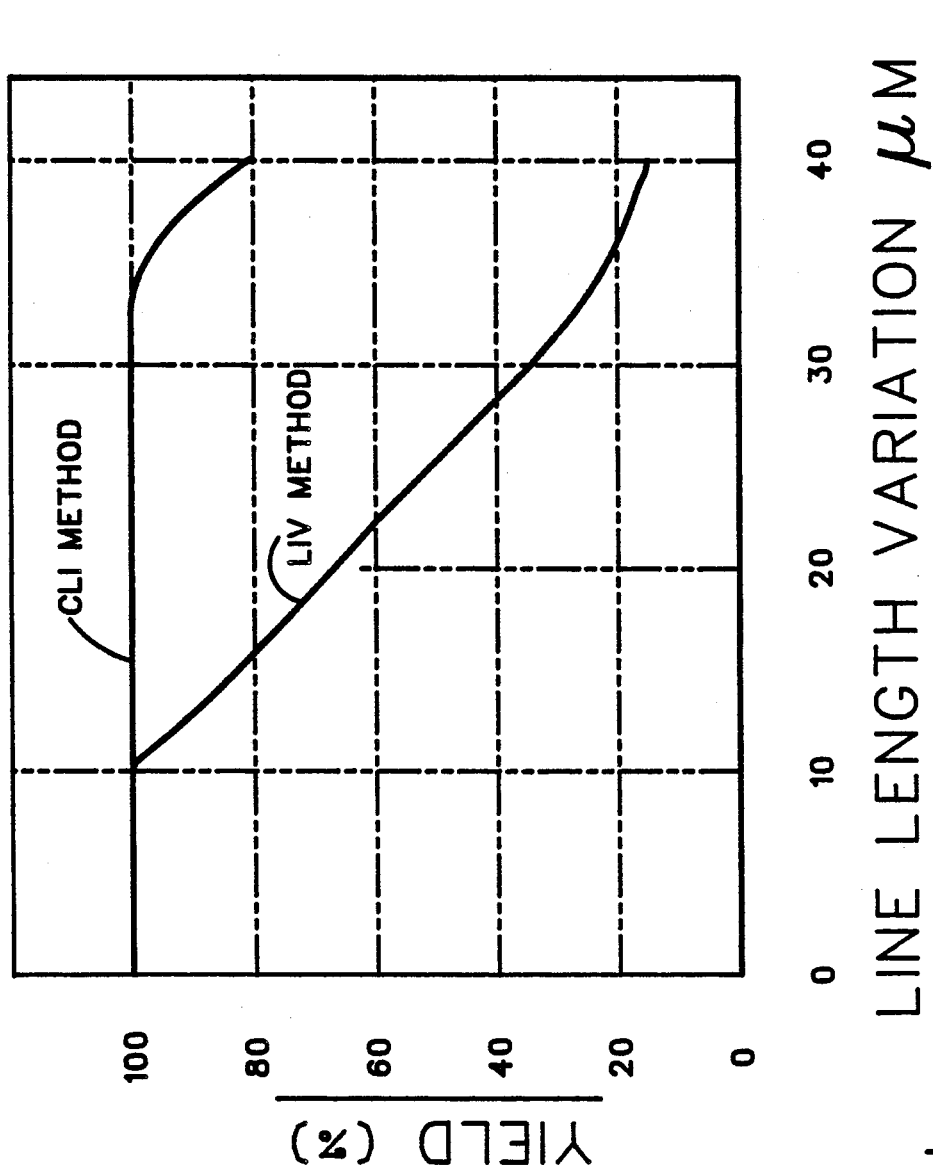
Figure 5C:
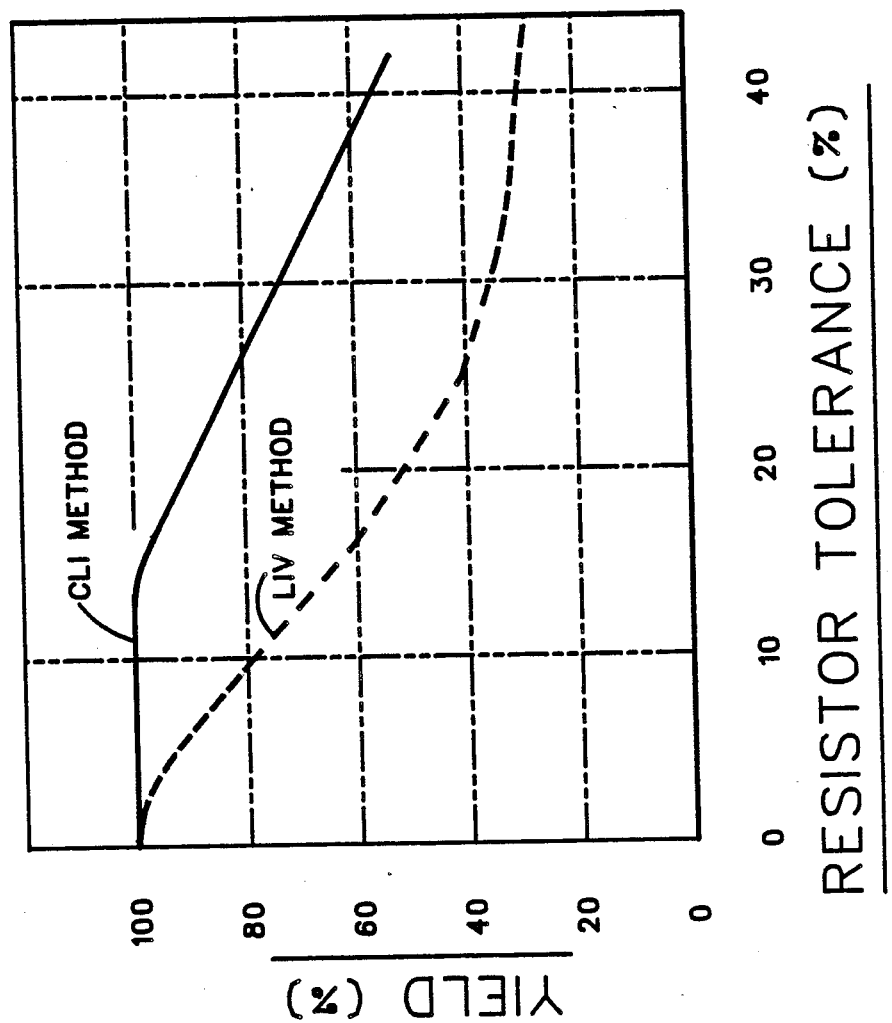

These circuit comparisons serve to partially illustrate how the present invention advances the art for impedance transformation at high frequencies. To further illustrate the advantages the present invention provides for circuit manufacture, a series of simulated device or circuit yields were derived for the two circuits illustrated in FIG. 3. The results of these derivations are illustrated in FIGS. 5a, 5b, and 5c. FIG. 5 illustrates the results for circuit yield in response to variation of S-parameter, resistor tolerance, and line length variations. The criteria used for the simulation analysis assumed that if circuit gain decreased by more than 10 percent or if the magnitude of the input or output return loss degraded by more than 20 percent, the circuit was considered a failure or reject.

By statistically varying the three important processing parameters one at a time, their impact on circuit production for a monolithic device can be statistically approximated. FIG. 5a shows the circuit yield variation in response to S-Parameter variations, FIG. 5b the yield in response to line length variations, and FIG. 5c the yield corresponding to resistor changes. The small inductances required in the LIV circuit to achieve the desired output impedances and the mismatching of the approach. Those skilled in the art will readily recognize the substantial improvement that the new constant line impedance technique brings to the art of impedance transformation.

EXAMPLE

Figure 6:
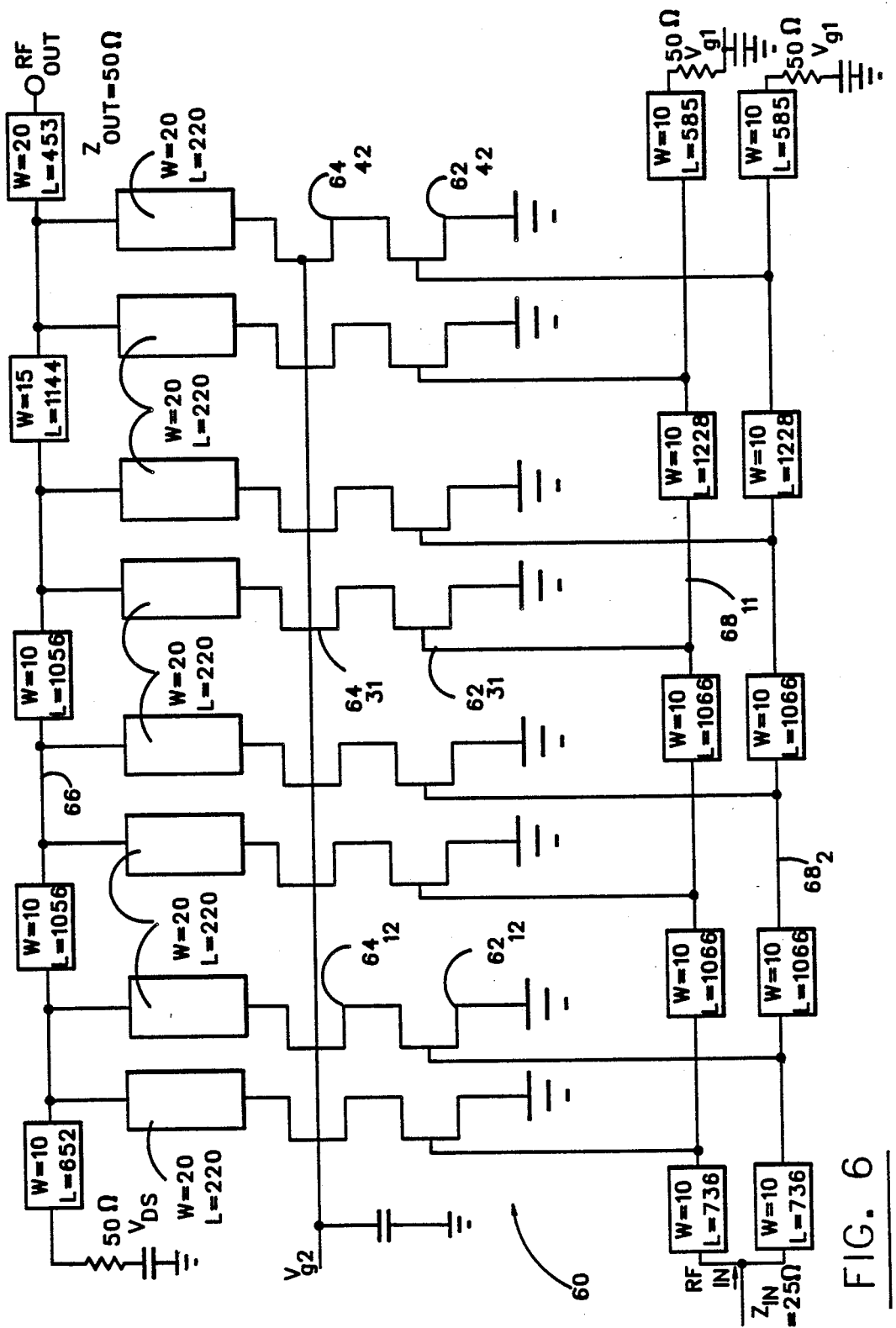
FIG. 6 illustrates an exemplary embodiment of the apparatus of FIG. 2.

An exemplary embodiment of the invention for use in microwave circuits was designed and constructed as a monolithic device. The circuit employed for this manufacturing example is illustrated in FIG. 6. As seen in FIG. 6, the distributed amplifier transformation circuit 60 is designed to accommodate an input impedance of 25 ohms and an output impedance of 50 ohms. The cascode transistor pairs employed in the circuit 60 each comprise 0.5 μm gate length GaAs FETs 62 and 64. This type of FET is very useful in manufacturing monolithic circuits for the operating frequencies of interest. The passive elements for the inductances comprise transmission lines whose lengths were adjusted for maximum signal gain and minimum return loss. The transistor widths were predetermined by simulations to be 180 μm to obtain a desired 2-20 GHz bandwidth. The common source FETs $62_{m1}$ and $62_{m2}$ were designed as single FET structures using a split source in order to bring the gate connection out. The common gate FETs 64 were designed as single FET structures with gate connections on both sides. A combined dual FET structure was formed which resulted in minimized parasitic capacitances and minimum complexity for easy circuit implementation.

Figure 7:
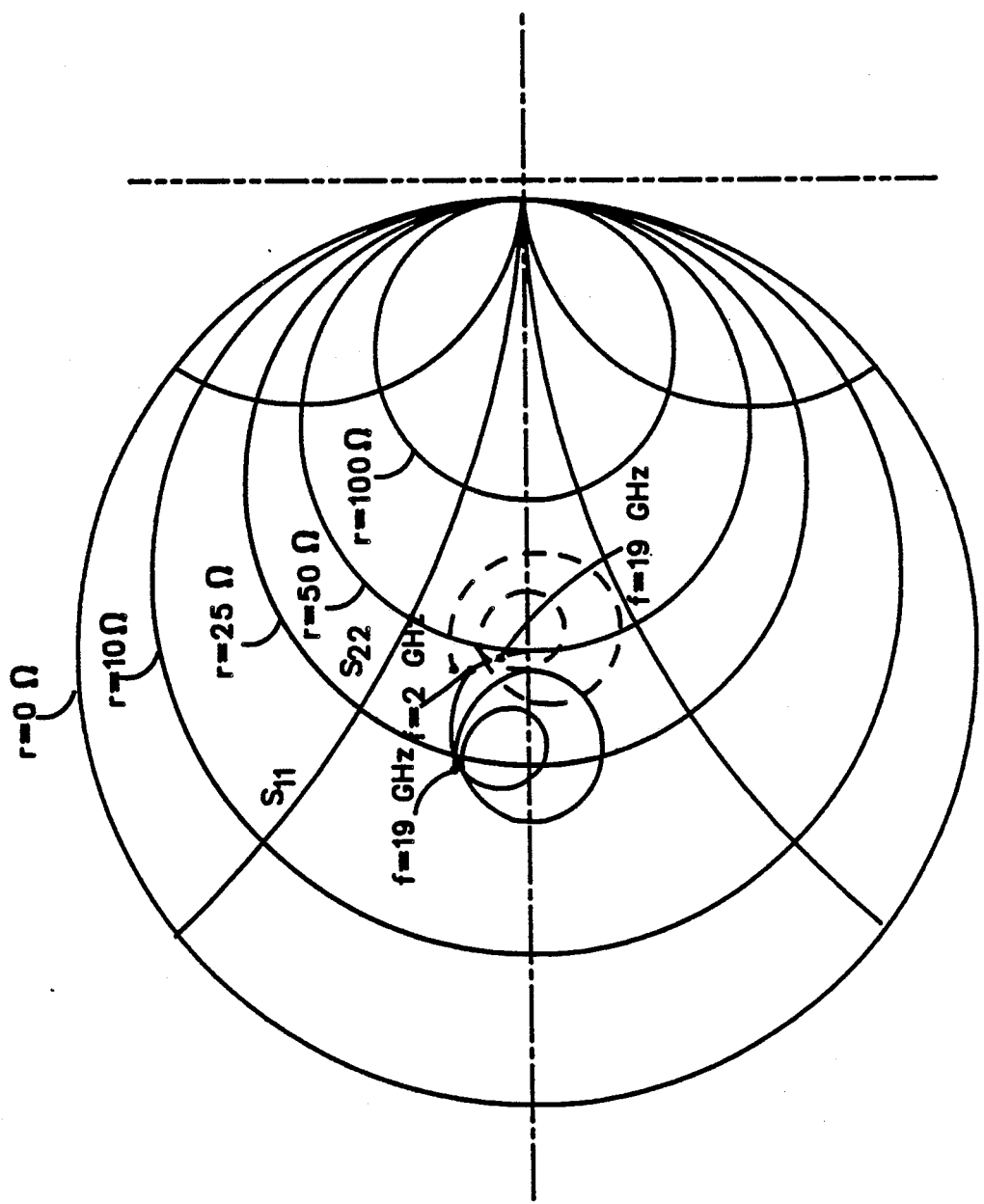
FIG. 7 provides graphical representation of characteristic impedance versus frequency for the circuit of FIG. 6.

The constructed circuit was probed, and the measured input and output impedances obtained are illustrated in graphic form in FIG. 7. In FIG. 7, a Smith chart normalized to 50 is used to clearly show an amplifier input impedance close to 25 ohm and output characteristic impedance of about 50 ohm over the desired frequency range of 2-19 GHz.

Figure 8:
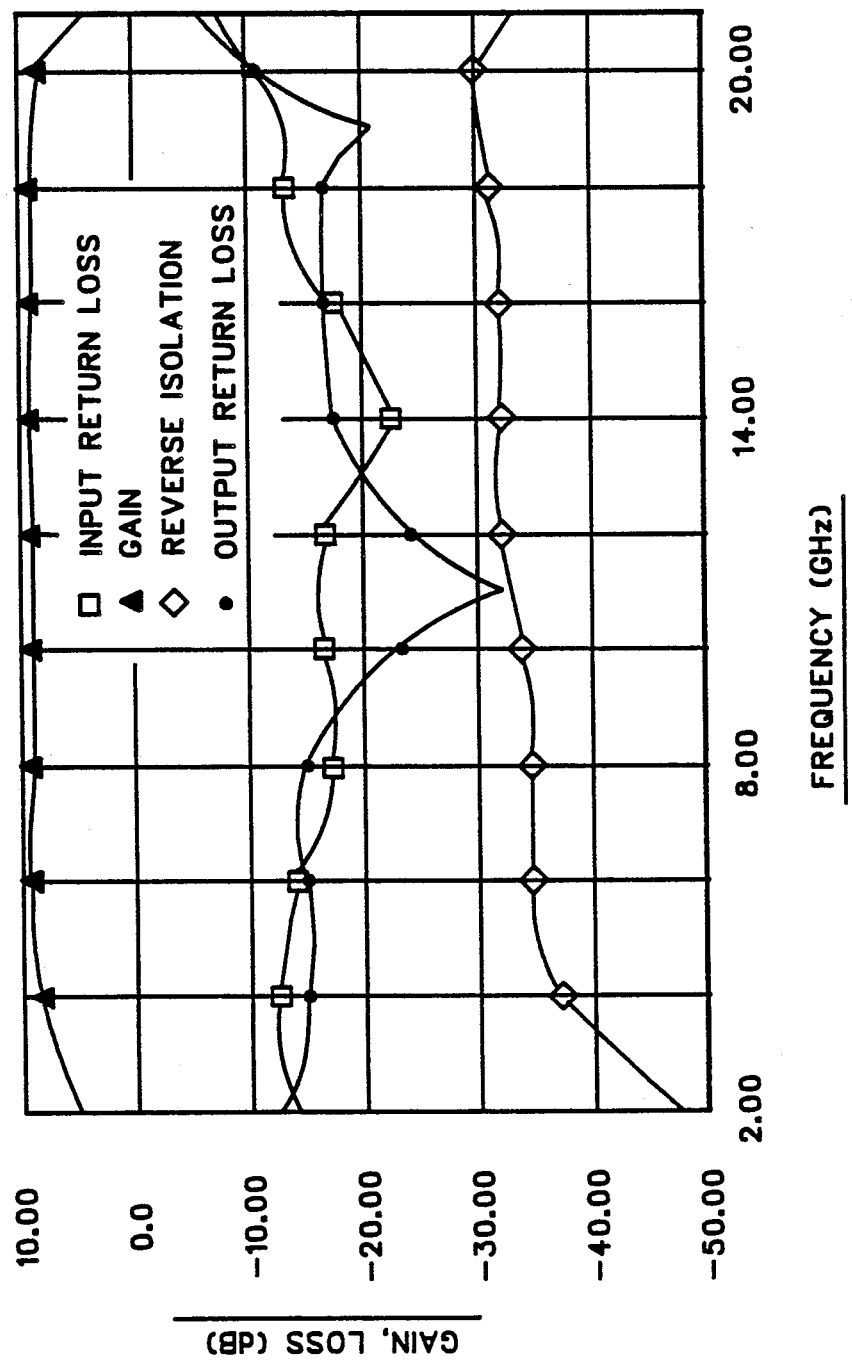
FIG. 8 provides graphical representation of gain and input and output return loss characteristics versus frequency for the circuit of FIG. 6.

The gain for the circuit of FIG. 6 is illustrated in FIG. 8. In order to plot a true gain and return loss for the amplifier 60, the S-parameters measured in a 50 ohm environment must be translated via simulation to reflect a 25 ohm input termination. The results of this translation are illustrated in FIG. 8. From FIG. 8, the circuit of FIG. 6 is seen to obtain a gain of 9±1 dB from 4 to 20 GHz and a return loss at the input and output of more than 12 dB from 2 to 19 GHz. The DC drain bias was established at about 150 mA at 4 volts for a total DC power consumption of about 600 mW. The 1 dB compression point was measured to be greater than 20 dBm at 9 GHz.

Unfortunately, when very large impedance transformations are required, the above constant line impedance method may be impractical because of the large capacitance value obtained on the input transmission line. A large capacitance limits the bandwidth and, as previously stated, can reduce the circuit yield to unacceptable levels. In addition, a large DC current is required to power the large number of parallel transistors which is undesirable in a power limited environment and for minimizing heat. Therefore, an alternate embodiment is illustrated in FIG. 9 which overcomes these limitations.

Figure 9:
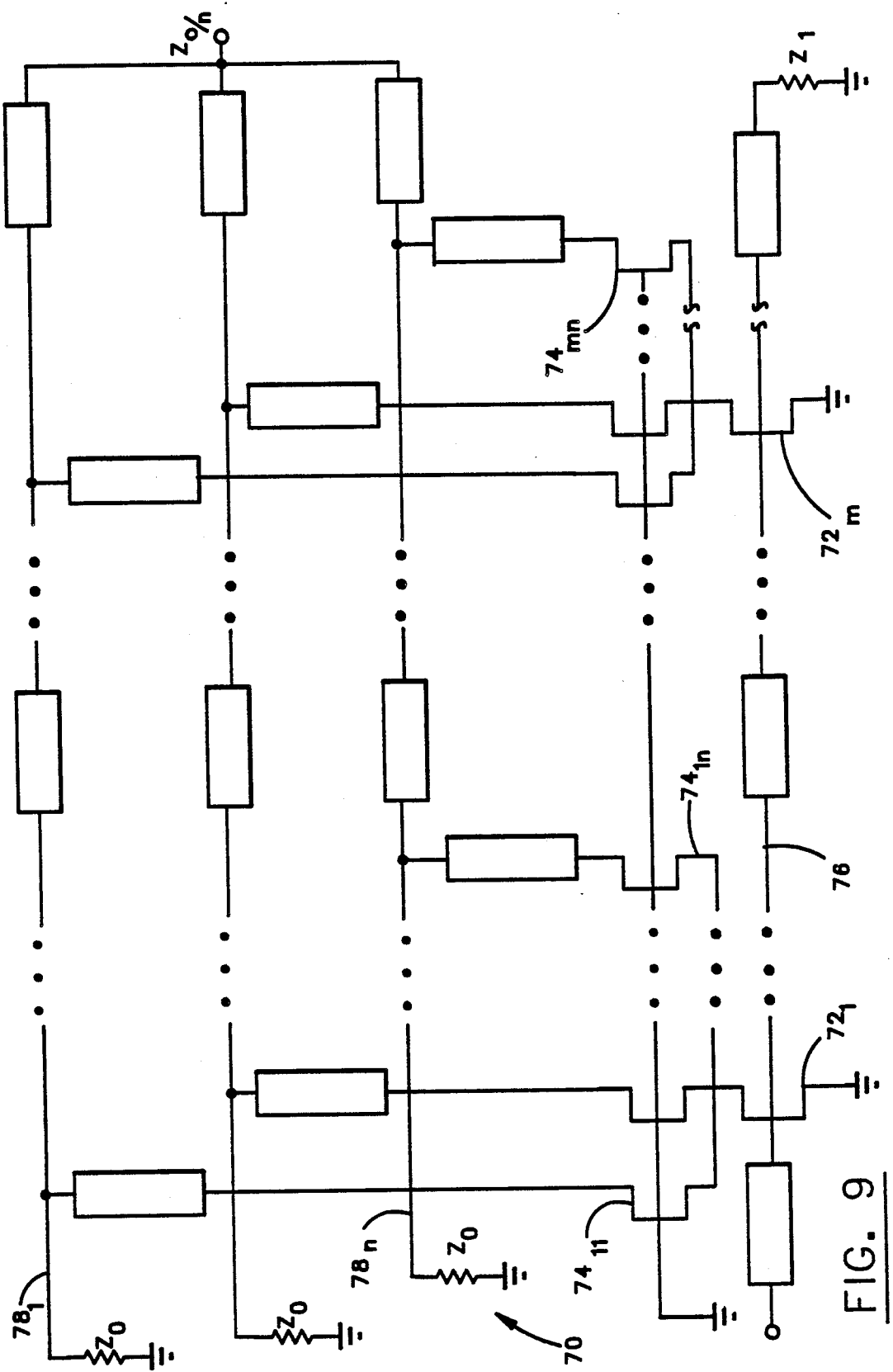
FIG. 9 illustrates an alternate embodiment of the apparatus of FIG. 2 for achieving large transformation ratios.

FIG. 9 illustrates a distributed amplifier impedance transformation apparatus 70 using a single input transmission line 76 and a series of parallel transmission lines $78i$ through $78n$ being connected to active elements in the form of FET cascode pairs. In FIG. 9, the common gate FET of the cascode pair used in previous embodiments is replaced by a tier of n source coupled common gate FETs, 74, each having a gate width on the order of 1/n times the gate width of a common source FET 72. The smaller gate widths of each of the common gate FETs $74_{mn}$ causes the aggregate DC current of the common gate FETs $74_{mn}$ to match that of the common source FET $72_m$. The high output impedance of the common gate FET $74_{mn}$ is sufficient to isolate each of the output drain lines between adjacent FETs so that the total resulting output return loss approaches that of the constant line impedance circuit previously disclosed. The DC power required to operate the transformation circuit 70 is, however, reduced by a factor of n. Additionally, the bandwidth is theoretically increased by a factor of n. However, there are limits on the number of common gate FETs 74 mn that can be placed in series with each common source FET 72 m. The corresponding and necessary decrease in size of each common gate transistor with each additional parallel FET 74 added, results in a higher output impedance for each FET and a correspondingly degrading output gain match with the output transmission lines 78 which must be accounted for in designing large impedance transformations.

Applicant has discovered that one advantage of this latter embodiment of the invention is its applicability as a broadband matching circuit for a semiconductor laser. Laser diode driver circuit applications typically require an 8:1 impedance transformation to bridge between a 50 ohm input impedance (control circuit) and a typical laser diode having a 6.25 ohm impedance. Currently, there are no impedance matching circuits possible or useful for this application. The present invention, however, is useful for achieving such an impedance transformation.

Figure 10:
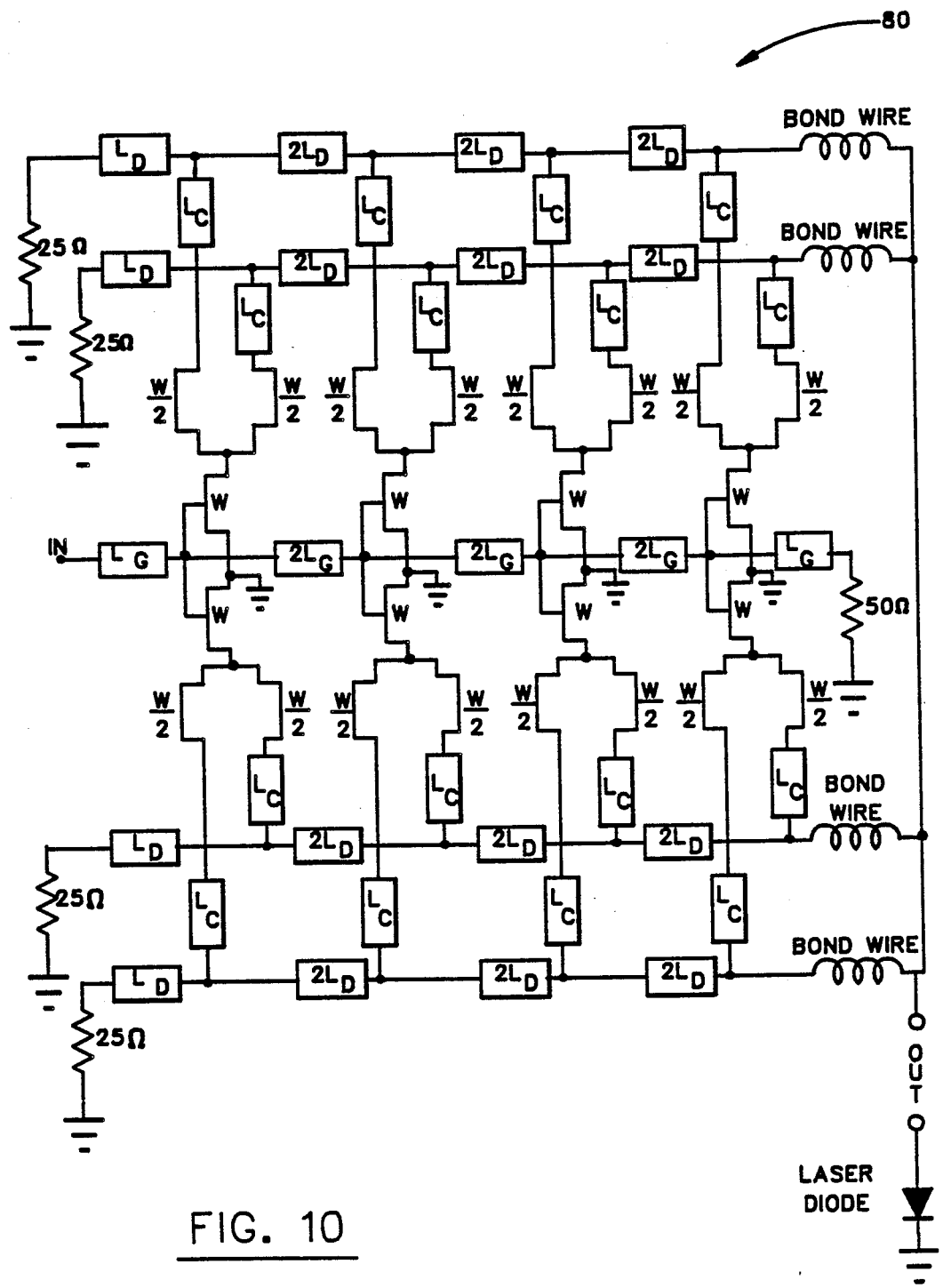
FIG. 10 illustrates a circuit implementation of the apparatus of FIG. 9.

A transformation circuit 80 comprising the necessary 8:1 impedance transformation typically required for a typical laser diode application is illustrated in FIG. 10. In FIG. 10, an 8:1 transformation is obtained by using the constant line impedance technique to achieve a 4:1 impedance ratio, and then using the LIV technique to achieve an additional 2:1 ratio on each of the parallel active elements or transformation lines. Those skilled in the art will recognize that while the input impedance of a laser is not strictly or purely real, it can be accurately represented as a series RL circuit at high frequency because the internal and parasitic capacitances of the diode are effectively swamped out by the bond wire inductance. To account for the bond wire, the final inductance employed for each transmission line or arm of the distributed transformation amplifier 80 becomes the bond wire inductance.

Figure 11:
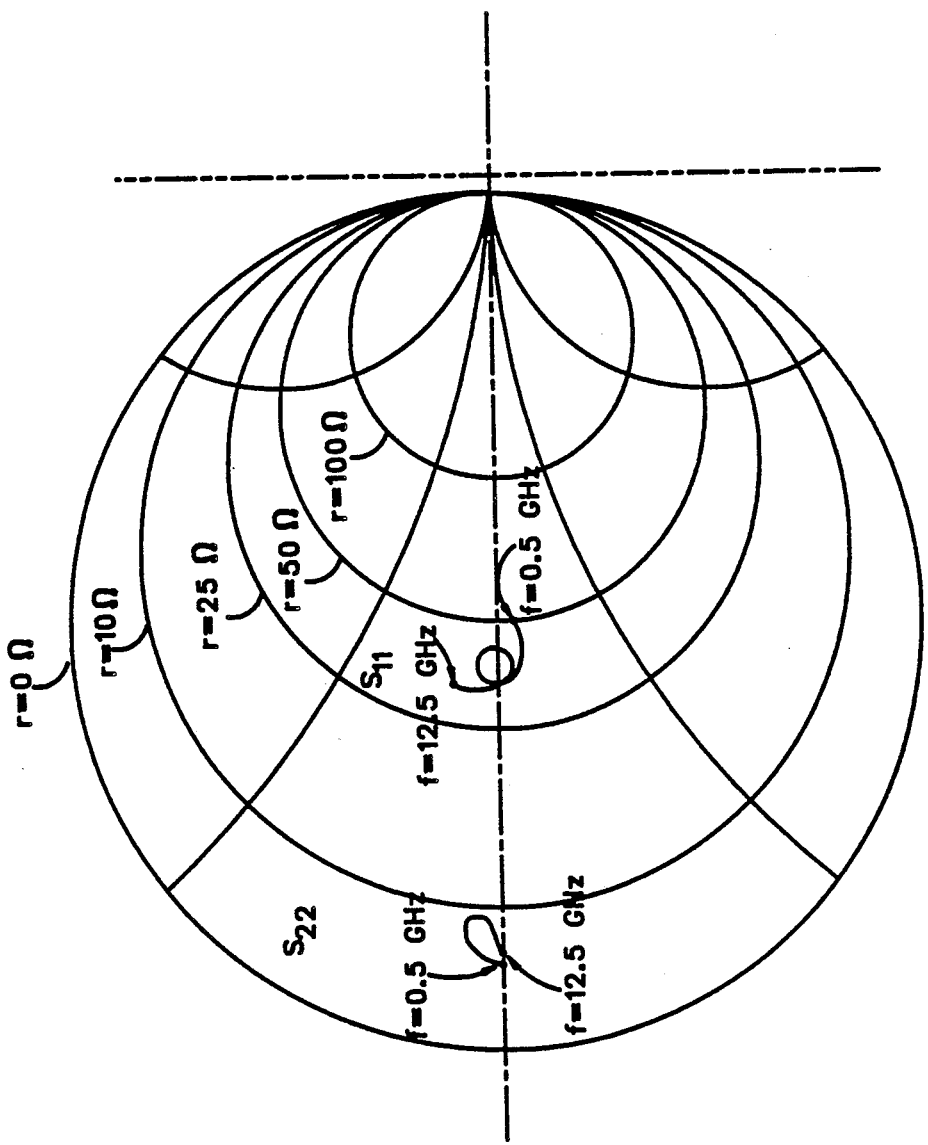
FIG. 11 provides graphical representation of characteristic impedance versus frequency for the circuit of FIG. 10.
Figure 12:
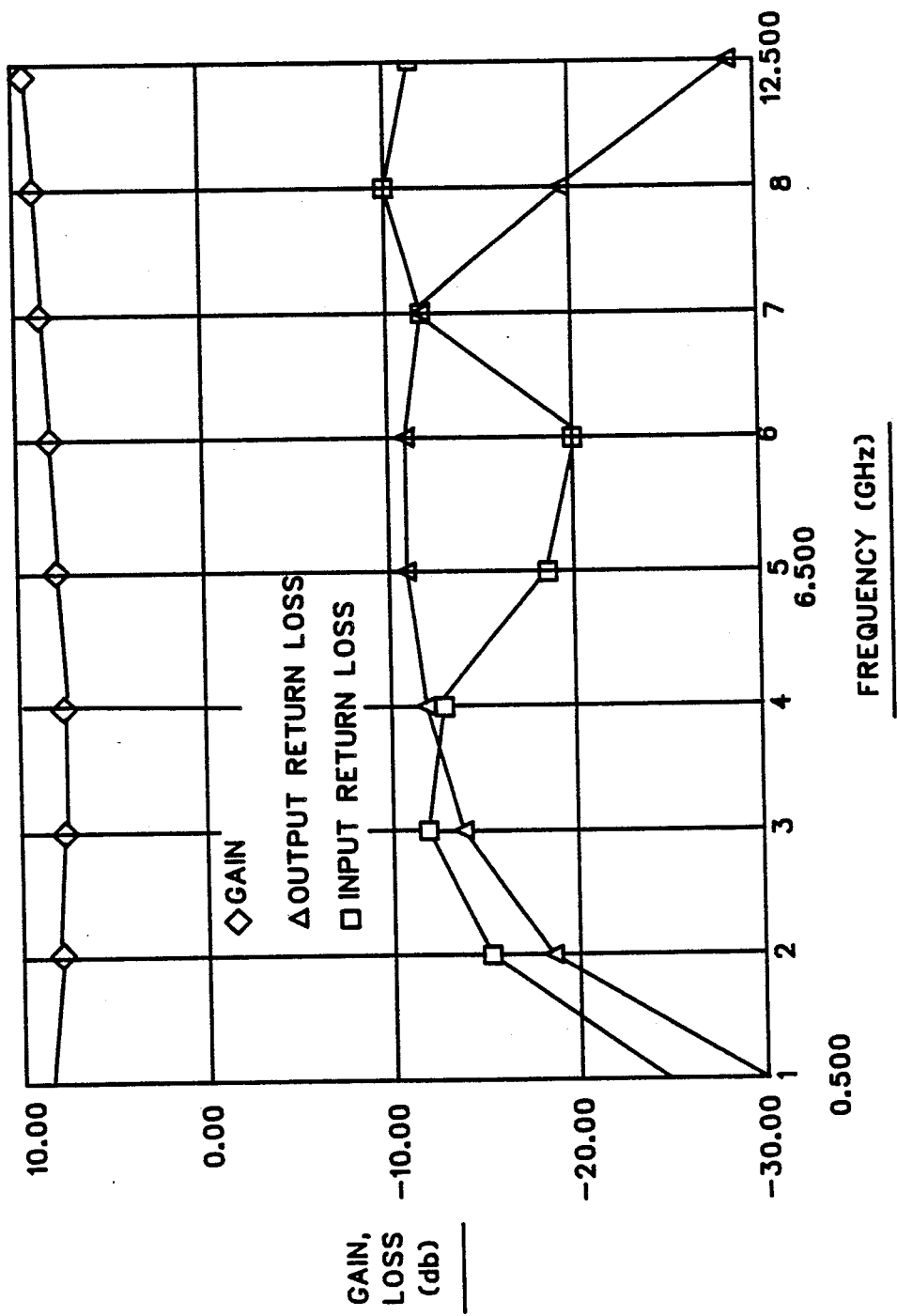
FIG. 12 provides graphical representation of gain and input and output return loss characteristics versus frequency for the circuit of FIG. 10.

Simulated results of using the broadband laser driver amplifier circuit 80 illustrated in FIG. 10 are derived and illustrated in FIGS. 11 and 12. As shown in FIG. 11, the laser driver circuit 80 has the desired impedance match over the frequency range from 0.5 to 12.5 GHz. As shown in FIG. 12, the laser driver circuit 80 obtains a gain of $8.5 \pm 1$ dB from 0.5 to 12.5 GHz and better than 10 dB loss at both the input and output. The transistor S-parameters used in the simulation for this derivation were measured from 200 $\mu$m gate width and 0.25 $\mu$m gate length AlGaAs HEMTs. Variation in length for the bonding wires ranging from 1 to 1000 $\mu$m resulted in less than a 1 dB degradation in gain and less than 4 dB degradation in output return loss while input return loss remained unchanged. Gain for the circuit remains substantially flat, independent of bond wire length variations. The laser driver circuit 80 shows clear potential for solving the laser diode driver matching problems and establishing new applications for laser diodes.

Figure 13:
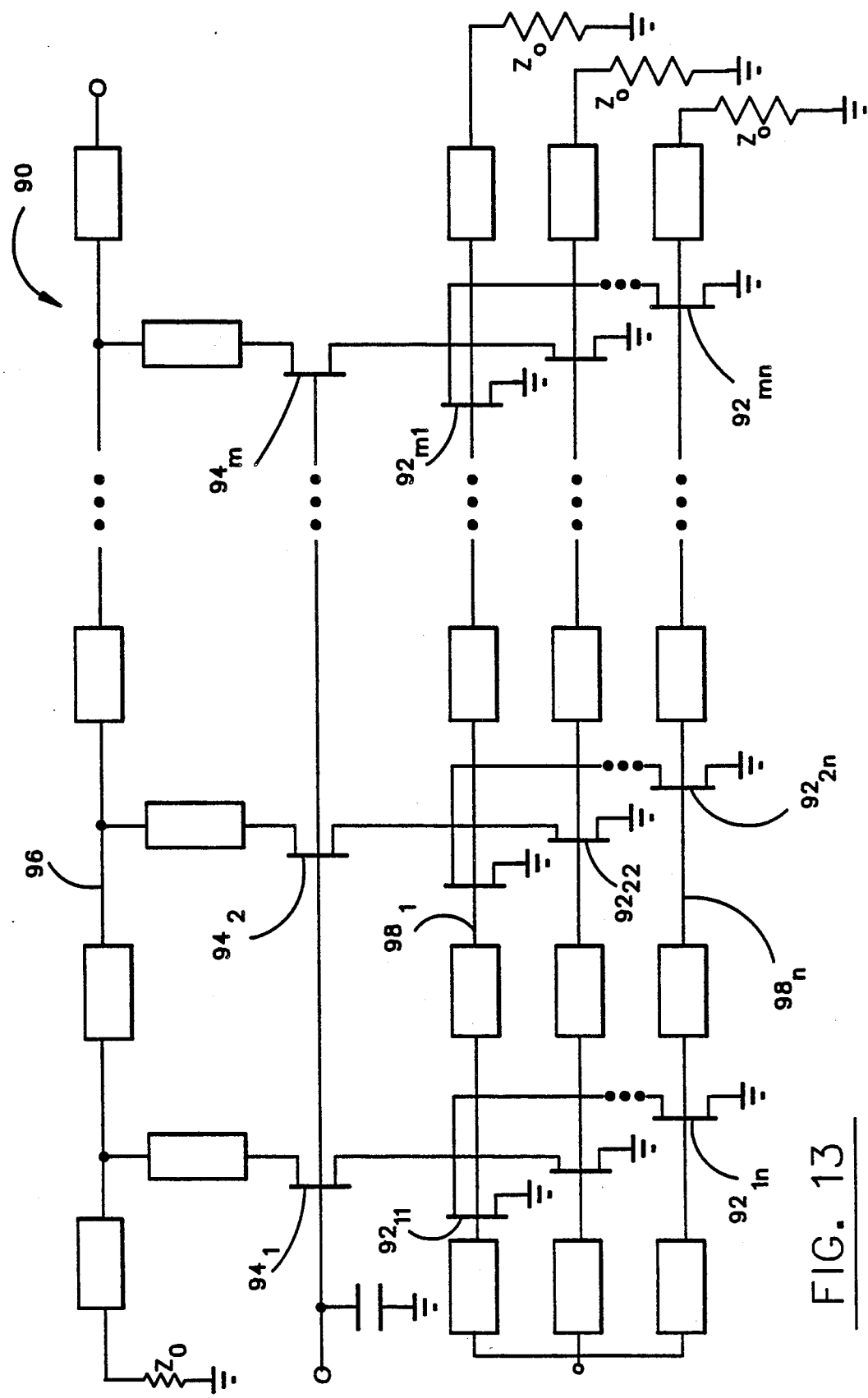
FIG. 13 illustrates an alternate embodiment of the apparatus of FIG. 10 for achieving large transformation ratios.

For other applications, a step-up transformation may be desired which also takes advantage of the embodiment of FIG. 9. A general schematic for a step-up version is illustrated in FIG. 13. In FIG. 13, the step-up impedance transformation apparatus 90 is shown with m active elements, each comprising n common source FETs 92 connected to one of n parallel input transmission lines 98. The drains for the FETs $92mn$ are connected to the source of a common gate FET $94m$ which transfers signals to the output transmission line 96. With the appropriate inductances as before, the circuit of FIG. 13 achieves a step-up function.

While the invention has been described using one input or output transmission line in conjunction with n parallel output or input transmission lines, respectively, this is not a limitation. The method and apparatus of the invention also contemplate the use of additional, multiple, parallel input or output transmission lines in conjunction with the n parallel output or input transmission lines, respectively. Such combinations allow the implementation of fractional impedance transformations such as, but not limited to, 2.5:1, 3.5:1, or 7.5:1. These transformations may better accommodate specific circuit applications required by those skilled in the art.

Figure 14:
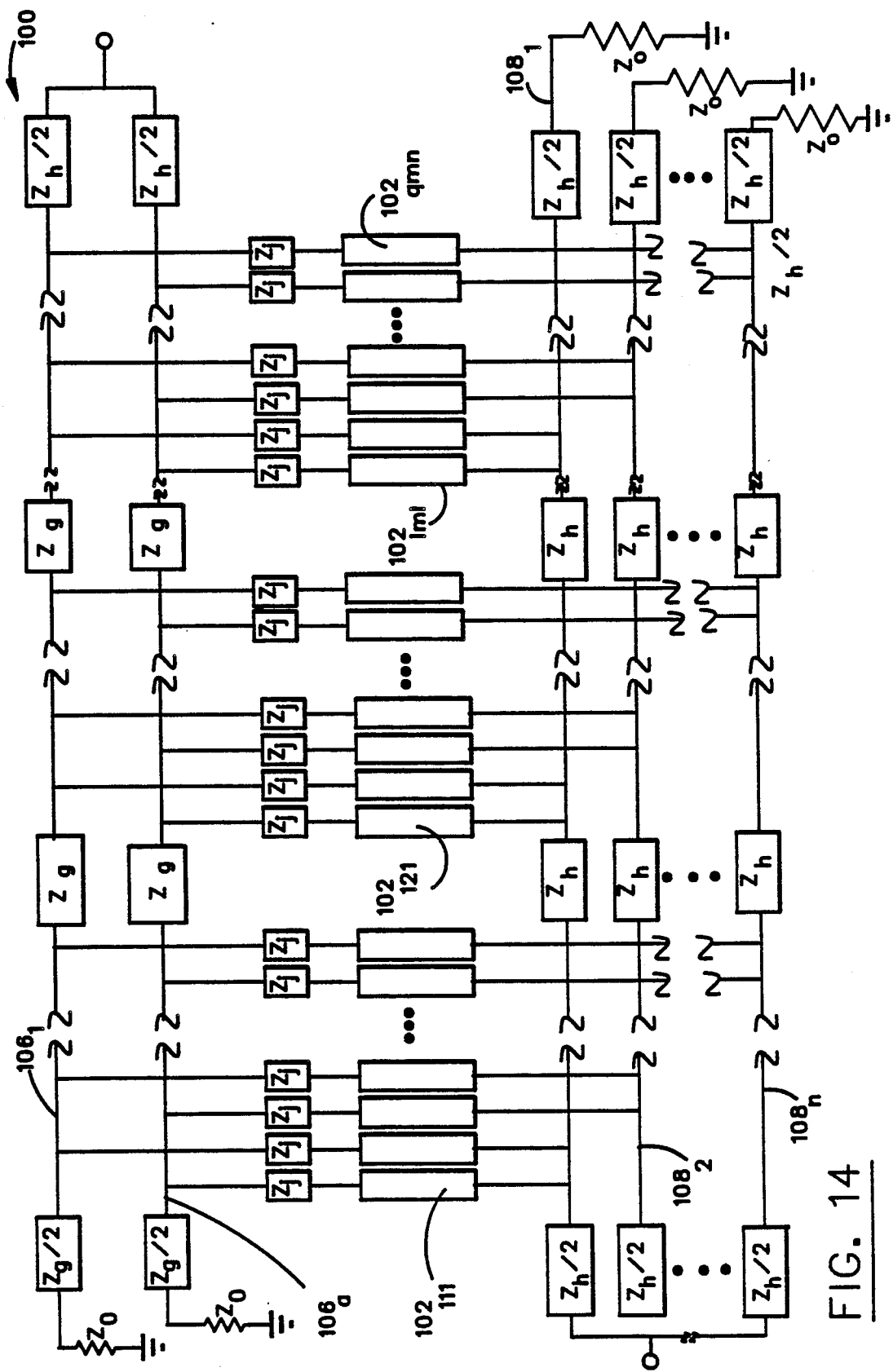
FIG. 14 illustrates an alternate embodiment of the apparatus of FIG. 2 for achieving fractional transformation ratios.

An apparatus for accomplishing fractional or multiple line input and output impedance transformation is illustrated in FIG. 14. In FIG. 14, an impedance transformation apparatus 100 comprises qn distributed amplifiers and each employs m active elements $102_m$ where q is an integer and q=3. However, it is readily apparent that q can have larger values as desired.

In this embodiment, every qth active element $102_{qmn}$ will be connected to a common first transmission line 106. The same qth active elements 102 connect to different second transmission lines $108_n$. Therefore, if q=2, then there are 2mn active elements and every 2nd element ($102_{111}$, $102_{211}$, $102_{311}$, $102_{121}$, $102_{221}$, $102_{321}$, $102_{131}$, $102_{231}$, and $102_{331}$) is connected to a common transmission line $106_q$ input or output. The same active elements are connected to different second transmission lines $108_1$, $108_2$, ... $108_n$.

The result is qm distributed amplifiers configured in parallel with q parallel input or output transmission lines and n parallel output or input transmission lines, respectively. The operation of this circuit obtains $qZ_0/n$ to $Z_0$ or $Z_0$ to $qZ_0n$ impedance transformations.

What has been described then is a new method and apparatus for performing impedance transformations. The disclosed embodiments of the invention provide impedance matching transformations for a broad range of applications including microwave antenna circuits. RF impedance transistions, and signal controllers. At least one laser diode driver embodiment has been disclosed which provides capabilities previously unknown in the laser art.

The foregoing description of preferred embodiments have been presented for purposes of illustration and description. It is not intended to be exhaustive nor to limit the invention to the precise forms disclosed, and many modifications and variations are possible in light of the above teaching. Such variations include various values for n and q as well as active elements, bias voltages, or additional components. The embodiments were chosen and described to best explain the principles of the invention and its practical application to thereby enable others skilled in the art to best utilize the invention in various embodiments and with various modifications as are suited to the particular use contemplated. It is intended that the scope of the invention be defined by the claims and their equivalents.

What I claim as my invention is:

1. An apparatus for performing impedance transformations, comprising a plurality of n distributed amplifiers each having a plurality of m active elements disposed between first and second synthetic transmission lines, each of said n amplifiers having said first transmission line in common, said active elements of each amplifier being connected thereto and forming a first impedance interface, and each second transmission line being a separate, non-common transmission line, connected as n parallel transmission lines each to a single one of said n distributed amplifiers to form a single second impedance interface wherein said active elements comprise a cascode pair of FET type transistors with a first FET connected through a gate to said first transmission line and through a drain to a source of a second FET having a second drain connected to said second transmission lines.

2. An apparatus for performing impedance transformations, comprising a plurality of n distributed amplifiers each having a plurality of m active elements disposed between first and second synthetic transmission lines, each of said n amplifiers having said first transmission line in common, said active elements of each amplifier being connected thereto and forming a first impedance interface, and each second transmission line being a separate, non-common transmission line, connected as n parallel transmission lines each to a single one of said n distributed amplifiers to form a single second impedance interface wherein said m active elements comprise m cascode connected tiers of transistors, each cascode tier comprising a first FET connected through a gate to said first line and through a drain to a plurality of sources of a plurality of n second FETs each having their respective drains connected to one of said second transmission lines.

3. The apparatus of claim 2 wherein said common line is an input and said parallel non-common lines each terminate in substantially the same impedance and for an output of differing impedance, and the transformation characteristic impedance is an impedance of said common line divided by an impedance of said parallel lines time 1/n.

4. The apparatus of claim 2 wherein said m first FETs comprise common source FETs.

5. The apparatus of claim 2 wherein said second FETs comprise common gate FETs.

6. Apparatus for performing impedance transformations, comprising a plurality of qn distributed amplifiers, with q>2, each having a plurality of m active elements disposed between first and second synthetic transmission lines, there being q first and at least n second transmission lines with n amplifiers having at least one of said q first transmission lines but not said n second transmission lines in common, whereby q common first transmission lines are formed, with said q first transmission lines being further connected in parallel to form a single first impedance interface, and said second transmission lines being further connected in parallel to form a single second impedance interface.

7. The apparatus of claim 6 wherein said q parallel common first transmission lines each terminate with a first predetermined impedance and form an input and said parallel second transmission lines each terminate with a second predetermined impedance and form an output of differing impedance, and the transmission characteristic impedance is the first impedance times n divided by the second impedance times q.

8. The apparatus of claim 6 wherein said q parallel common first transmission lines are each terminated with a first predetermined impedance and form an output and said parallel second transmission lines are each terminated with a second predetermined impedance and form an input of differing impedance, and the transformation characteristic impedance is q times the second impedance divided by the first impedance times n.

9. The apparatus of claim 6 wherein each of said active elements comprises a cascode pair of transistors.

10. The apparatus of claim 9 wherein said transistors comprise a first FET connected through a gate to said first transmission line and through a drain to a source of a second FET having a second drain connected to said second transmission line.

11. The apparatus of claim 10 wherein said m first FETs comprise common source FETs.

12. The apparatus of claim 10 wherein said first FETs comprise common gate FETs.

13. A method of transforming between two impedance loads, comprising the steps of:
providing a plurality of qn parallel distributed amplifiers, each distributed amplifier configured for amplifying an input signal transferring said signal between first and second transmission lines having distributed inductive elements;
configuring said distributed amplifiers with q common first transmission lines, where q>2, using the same inductive elements;
terminating each of said q common transmission lines with a first predetermined impedance;
configuring said distributed amplifiers with n different second transmission lines comprising separate inductive elements; p1 terminating each of said n second transmission lines with a second predetermined impedance;
connecting said q first transmission lines in parallel so as to form a first impedance interface;
connecting said n second transmission lines in parallel so as to form a second impedance interface;
introducing a signal into said second transmission lines to obtain a first desired transformation ratio as determined by a ratio of said first predetermined impedance and n/q times said second predetermined impedance; and
introducing a signal into said first transmission lines to obtain a second desired transformation ratio as determined by a ratio of q/n times said first predetermined impedance and said second predetermined impedance.

14. The method of claim 13 further comprising the steps of:
applying input signals to said q common transmission lines as an input impedance interface;
terminating said q common transmission lines with an impedance of value $Z_i$, where $Z_i/q$ is a desired characteristic input load impedance; and
terminating said second transmission lines with an impedance of value $Z_0$ where $Z_0/n$ is a desired characteristic output load impedance.

15. The method of claim 14 further comprising the step of setting the value of $Z_0$ substantially equal to $Z_i$.

16. The method of claim 13 further comprising the steps of:
applying input signals to said n parallel transmission lines as an input impedance interface;
terminating said q common transmission lines with an impedance of value $Z_0$, where $Z_0/q$ is a desired characteristic output load impedance; and
terminating said second transmission lines with an impedance of value $Z_i$ where $Z_i/n$ is a desired characteristic input load impedance.

17. The method of claim 16 further comprising the step of setting the value of $Z_0$ substantially equal to $Z_i$.

18. An apparatus for performing impedance transformations, comprising a plurality of n distributed amplifiers each having a plurality of m active elements disposed between first and second synthetic transmission lines, each of said n amplifiers having said first transmission line in common, said active elements of each amplifier being connected thereto and forming a first impedance interface, and each second transmission line being a separate, non-common transmission line, connected to a single one of said n distributed amplifiers and in parallel to form a single second impedance interface wherein said m active elements comprise m cascode connected tiers of transistors, each cascode tier comprising a plurality of n first FETs each connected through a gate to one of said second transmission lines and through a drain to a source of a second FET having a drain connected to said first transmission line.

19. The apparatus of claim 18 wherein said plurality of FETs comprise common source FETs.

20. The apparatus of claim 18 wherein said common line is an output and said parallel non-common lines form an input of differing impedance, where the impedance of each non-common line is substantially the same, and the transformation characteristic impedance is determined by the ratio of the impedance of said common transmission line to 1/n times the impedance of one of said non-common transmission lines.

21. Apparatus for performing impedance transformations, comprising a plurality of qn distributed amplifiers, with q>2, each having a plurality of m active elements disposed between first and second synthetic transmission lines, there being q first transmission lines and n second transmission lines with n of said qn amplifiers being connected in common to each of said q first transmission lines but not in common to said n second transmission lines, and q of said amplifiers being connected in common to each of said n second transmission lines but not in common to said first transmission lines, whereby q common first and n common second transmission lines are formed, with said q first transmission lines being further connected in parallel to form a single first impedance interface, and said n second transmission lines being further connected in parallel to form a single second impedance interface.

22. The apparatus of claim 21 wherein said q common transmission lines are each terminated with a first predetermined impedance and form an input and said n transmission lines are each terminated with a second predetermined impedance and form an output of differing impedance, and the transformation characteristic impedance is determined by the ratio of 1/q times the first impedance to 1/n times the second impedance.

23. The apparatus of claim 21 wherein said n transmission lines are each terminated with a first predetermined impedance and form an input and said q common transmission lines are each terminated with a second predetermined impedance and form an output of differing impedance, and the transformation characteristic impedance is determined by q/n times the ratio of the first to the second impedance.

24. The apparatus of claim 23 wherein the impedance of each of said q transmission lines is substantially equal to the impedance of each of said n transmission lines.

25. A method of transforming between two impedance loads, comprising the steps of:
providing a plurality of qn parallel distributed amplifiers, each distributed amplifier having m active elements each configured for amplifying an input signal and transferring said signal between first and second transmission lines;
configuring said distributed amplifiers with q common first transmission lines, where q>2, and terminating said common lines with a first predetermined impedance;
configuring said distributed amplifiers with at least n common second transmission lines and terminating each of said second lines with a second predetermined impedance;
connecting said first transmission lines in parallel;
connecting said second transmission lines in parallel;
introducing a signal into said first transmission lines for one desired transformation ratio as determined by a ratio of said first predetermined impedance and q/n times said second predetermined impedance; and
introducing a signal into said second transmission lines to achieve a second desired transformation ratio as determined by a ratio of q/n times said second predetermined impedance and said first predetermined impedance.

26. Apparatus for performing impedance transformations, comprising a plurality of qn distributed amplifiers, with q>2, each having a plurality of m active elements in the form of cascode connected tiers of FETs disposed between first and second synthetic transmission lines, there being q first and n second transmission lines with n amplifiers having at least one of said q first transmission lines but not said n second transmission lines in common, whereby q common first transmission lines rae formed, each cascode connected FET tier comprising a first FET connected through a gate to one of said q common first transmission lines and through a drain to each source of a plurality of n second FETs each having a respective second drain connected to one of said n second transmission lines, with said q first transmission lines being further connected in parallel to form a single first impedance interface, and said second transmission lines being further connected in parallel to form a single second impedance interface.

27. The apparatus of claim 26 wherein said first FETs comprise common source FETs.

28. The apparatus of claim 26 wherein said second FETs comprise common gate FETs.

29. Apparatus for performing impedance transformations, comprising a plurality of qn distributed amplifiers, with q>2, each having a plurality of m active elements in the form of cascode connected tiers of FETs disposed between first and second synthetic transmission lines, there being q first and n second transmission lines with n amplifiers having at least one of said q first transmission lines but not said n second transmission lines in common, whereby q common first transmission lines are formed, each cascode connected FET tier comprising a plurality of n first FETs, each connected through a gate to one of said second transmission lines and through a drain to a source of a single common second FET, shared by n distributed amplifiers, having its respective second drain connected to one of said common first transmission lines.

30. Apparatus for performing impedance transformations, comprising a plurality of qn distributed amplifiers, with q>2, each having a plurality of m active elements in the form of cascode connected tiers of FETs disposed between first and second synthetic transmission lines, there being q first transmission lines and n second transmission lines with n of said qn amplifiers being connected in common to each of said q first transmission lines but not in common to said n second transmission lines, and q of said amplifiers being connected in common to each of said n second transmission lines but not in common to said first transmission lines, whereby q common first and n common second transmission lines are formed, each of said cascode connected tiers comprising a first FET connected through a gate to one of said q common first transmission lines and through a drain to each source of a plurality of n second FETs each having a respective second drain connected to one of said n second transmission lines, with said q first transmission lines being further connected in parallel to form a single first impedance interface, and said n second transmission lines being further connected in parallel to form a single second impedance interface.

31. The apparatus of claim 30 wherein said common first FETs comprise common source FETs.

32. Apparatus for performing impedance transformations, comprising a plurality of qn distributed amplifiers, with q>2, each having a plurality of m active elements in the form of cascode connected tiers of FETs disposed between first and second synthetic transmission lines, there being q first transmission lines and n second transmission lines with n of said qn amplifiers being connected in common to each of said q first transmission lines but not in common to siad n second transmission lines, and q of said amplifiers being ocnnected in common to each of said n second transmission lines but not in common to said first transmission lines, whereby q common first and n common second transmission lines are formed, each of said cascode connected tiers comprising a plurality of q first FETs each ocnnected through a gate to one of said q first transmission lines and through a drain to a source of a second FET having a second drain connected to one of said n second transmission lines, with said q first transmission lines being further connected in parallel to form a single first impedance interface, and said n second transmission lines being further connected in parallel to form a single second impedance interface.

33. Apparatus for performing impedance transformations, comprising a plurality of qn distributed amplifiers, with $q>2$, each having a plurality of m active elements in the form of cascode connected tiers of FETs disposed between first and second synthetic transmission lines, there being q first transmission lines and n second transmission lines with n of said qn amplifiers being connected in common to each of said q first transmission lines but not in common to said n second transmission lines, and q of said amplifiers being connected in common to each of said n second transmission lines but not in common to said first transmission lines, whereby q common first and n common second transmission lines are formed, each of said cascode connected tiers comprising a plurality of n first FETs each connected through a gate to one of said n second transmission lines and through a drain to a source of a second FET having a second drain connected to one of said q second transmission lines, with said q first transmission lines being further connected in parallel to form a single first impedance interface, and said n second transmission lines beimg further connected in parallel to form a single second impedance interface.

* * * * *